United States Patent
Kim

(10) Patent No.: US 8,797,799 B2
(45) Date of Patent: Aug. 5, 2014

(54) DEVICE SELECTION SCHEMES IN MULTI CHIP PACKAGE NAND FLASH MEMORY SYSTEM

(75) Inventor: Jin-Ki Kim, Kanata (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 38 days.

(21) Appl. No.: 13/611,580

(22) Filed: Sep. 12, 2012

(65) Prior Publication Data

US 2013/0176788 A1      Jul. 11, 2013

Related U.S. Application Data

(60) Provisional application No. 61/583,408, filed on Jan. 5, 2012.

(51) Int. Cl.
    *G11C 15/00* (2006.01)
    *G11C 16/04* (2006.01)
    *G11C 16/26* (2006.01)
    *G11C 15/04* (2006.01)

(52) U.S. Cl.
    CPC .......... *G11C 15/046* (2013.01); *G11C 16/0483* (2013.01)
    USPC ............. 365/185.17; 365/49.17; 365/189.04; 365/189.07; 365/230.03; 365/230.08; 365/233.18

(58) Field of Classification Search
    CPC ........................... G11C 15/046; G11C 16/0483
    USPC ............. 365/185.17, 189.04, 230.03, 230.08, 365/233.18
    See application file for complete search history.

(56) References Cited

U.S. PATENT DOCUMENTS

| | | | |
|---|---|---|---|
| 3,810,105 A * | 5/1974 | England | 710/43 |
| 5,860,080 A | 1/1999 | James et al. | |
| 6,223,230 B1 * | 4/2001 | Garnett et al. | 710/26 |
| 6,338,108 B1 | 1/2002 | Motomura | |
| 6,587,894 B1 * | 7/2003 | Stracovsky et al. | 710/6 |
| 6,842,393 B2 | 1/2005 | Ryan et al. | |
| 8,199,598 B2 * | 6/2012 | Oh et al. | 365/221 |
| 8,433,874 B2 * | 4/2013 | Oh et al. | 711/167 |
| 2007/0165457 A1 * | 7/2007 | Kim | 365/185.11 |
| 2009/0043932 A1 * | 2/2009 | Bernardi | 710/110 |
| 2010/0115172 A1 * | 5/2010 | Gillingham et al. | 710/310 |

OTHER PUBLICATIONS

Kenichi Imamiya, et al., "A 125-mm2 1-Gb NAND Flash Memory With 10-MByte/s Program Speed," IEEE J Solid-State Circuits, vol. 37, No. 11, pp. 1493-1500, Nov. 2002.

June Lee et al., "A 90-nm CMOS 1.8-V 2-Gb NAND Flash Memory for Mass Storage Applications," IEEE J Solid-State Circuits, vol. 38, No. 11, pp. 1934-1942, Nov. 2003.

Ken Takeuchi, et al., "A 56nm CMOS 99mm2 8Gb Multi-level NAND Flash Memory with 10MB/s Program Throughput," ISSCC Dig. Tech. Paper, pp. 144-145, Feb. 2006.

Samsung's 8Gb SLC NAND Flash Specification: ds_k9f8g08x0m_rev10.pdf, Mar. 31, 2007.

Samsung's 16Gb/32Gb/64Gb SLC NAND Flash Specification: ds_k9xxg08uxm_rev10.pdf, Mar. 31, 2007.

* cited by examiner

*Primary Examiner* — Ly D Pham

(57) ABSTRACT

Systems and methods are provided for perform device selection in multi-chip package NAND flash memory systems. In some embodiments, the memory controller performs device selection by command. In other embodiments, the memory controller performs device selection by input address.

30 Claims, 20 Drawing Sheets

DEVICE SELECTION SCHEMES IN MULTI CHIP PACKAGE NAND FLASH MEMORY SYSTEM

RELATED APPLICATION

This application claims the benefit of U.S. Provisional Patent Application No. 61/583,408 filed Jan. 5, 2012, which is hereby incorporated by reference in its entirety.

TECHNICAL FIELD

The present invention relates generally to semiconductor devices, for example, flash devices.

BACKGROUND

Recently, NAND flash devices have become very popular with respect to their use in mobile applications and mobile storage applications such as flash cards, digital audio/video players, cell phones, USB flash drives and solid state drives (SSDs) for hard disk drive (HDD) replacement. With an increase in the density requirement in the market, NAND flash provides high density with low cost.

NAND flash memories are described in, for example,

Kenichi Imamiya, et al., "A 125-mm2 1-Gb NAND Flash Memory With 10-MByte/s Program Speed," IEEE J Solid-State Circuits, vol. 37, no. 11, pp. 1493-1500, November 2002;

June Lee et al., "A 90-nm CMOS 1.8-V 2-Gb NAND Flash Memory for Mass Storage Applications," IEEE J Solid-State Circuits, vol. 38, no. 11, pp. 1934-1942, November 2003;

Ken Takeuchi, et al., "A 56 nm CMOS 99 mm2 8 Gb Multi-level NAND Flash Memory with 10 MB/s Program Throughput," ISSCC Dig. Tech. Paper, pp. 144-145, February 2006.

SUMMARY

According to one broad aspect, the invention provides a memory system comprising: a memory controller; a plurality of memory devices connected to the controller via a common bus with a multi-drop connection; wherein the memory controller performs device selection by command.

According to another broad aspect, the invention provides a memory system comprising: a memory controller; a plurality of memory devices connected to the controller via a common bus with a multi-drop connection; wherein the memory controller performs device selection by input address; each memory device comprising: a register containing a device identifier; a device identifier comparator that compares selected bits of a received input address to contents of the register to determine if there is a match, and wherein a given device is selected if the device identifier comparator of the given device determines there is a match.

According to another broad aspect, the invention provides a memory controller for use in a system comprising the memory controller and a plurality of memory devices connected to the controller via a common bus with a multi-drop connection, wherein the memory controller performs device selection by command.

According to another broad aspect, the invention provides a memory device for use in a system comprising a memory controller and a plurality of memory devices connected to the controller via a common bus with a multi-drop connection inclusive of the memory device, the memory device comprising: a command processor configured to process a command received via the common bus to determine if the command selects that particular memory device, and to act upon the command if the command selects that particular memory device.

According to another broad aspect, the invention provides a memory device for use in memory system comprising a memory controller, and a plurality of memory devices inclusive of the memory device connected to the controller via a common bus with a multi-drop connection, the memory device comprising: a register containing a device identifier; a device identifier comparator that compares selected bits of a received input address to contents of the register to determine if there is a match, and wherein the memory device is selected if the device identifier comparator determines there is a match.

According to another broad aspect, the invention provides a method in a memory system comprising a memory controller and a plurality of memory devices connected to the controller via a common bus with a multi-drop connection, the method comprising: performing device selection by command.

According to another broad aspect, the invention provides a method for use in a memory system comprising a memory controller and a plurality of memory devices connected to the controller via a common bus with a multi-drop connection, the method comprising: the memory controller performing device selection by input address; each memory device maintaining a device identifier in a register; a device identifier comparator in each memory device comparing selected bits of a received input address to contents of the register of the memory device to determine if there is a match, and wherein a given device is selected if the device identifier comparator of the given device determines there is a match.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The demand for memory capacity increase in flash memory systems has become significant and a multi chip package (MCP: multiple chips in a single package) is a very popular solution to increase packing density. However, the use of a separate chip enable pin (CE#) to each flash device in a single package requires system configuration changes (e.g., pin assignment change, PCB change) when the number of flash devices in a MCP increases.

NAND Flash Functional Block

Figure 1:
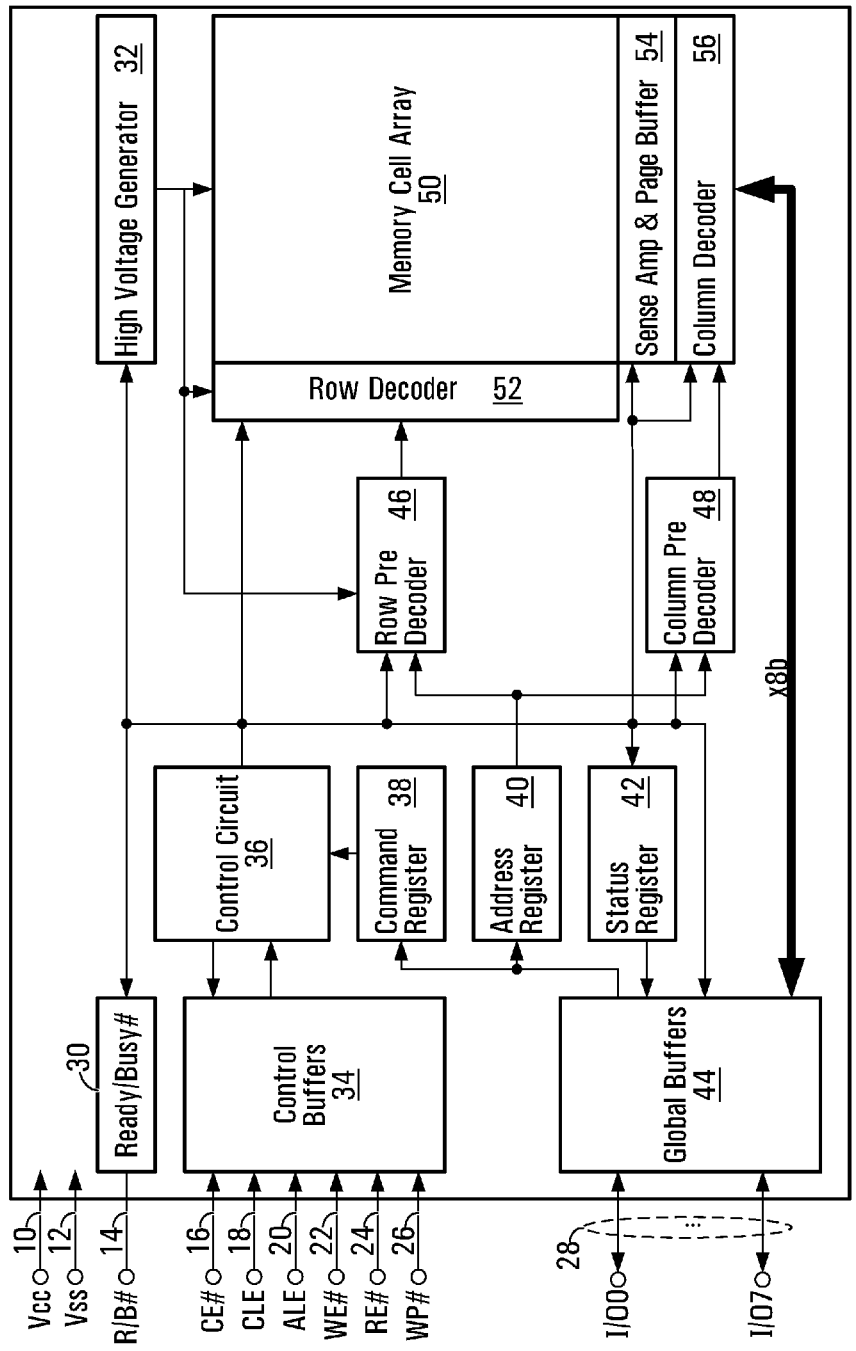
FIG. 1 illustrates a NAND flash functional block.

FIG. 1 illustrates a NAND flash functional block. Various inputs/outputs to the NAND functional block are depicted. In the following, # denotes active low (i.e. enable when the signal input is Low).

Command Latch Enable (CLE) input signal 18 is used to control loading of an operation mode command into an internal command register 38. The command is latched into the command register 38 from the I/O port 28 on the rising edge of the WE# signal 22 while CLE is High.

The Address Latch Enable (ALE) signal 20 is used to control loading address information into the internal address register 40. Address information is latched into the address register from the I/O port 28 on the rising edge of the WE# signal 22 while ALE is High.

Chip Enable (CE#) 16: the device goes into a low-power Standby mode if CE# goes High while the device is in Ready state. The CE# signal is ignored while the device is in Busy state (R/B#=L), such as during a Program or Erase or Read operation, and will not enter Standby mode even if the CE# input goes High.

The Write Enable (WE#) signal 22 is used to control the acquisition of data from the I/O port 28.

The Read Enable signal (RE#) 24 controls serial data output. Data is available after the falling edge of RE#. The content of address register is also incremented (Address=Address+I) on this falling edge.

I/O Port (I/O0 to 7) 28: I/O0 to I/O7 pins are used as a port for transferring address, command and input/output data to and from the device.

Write Protect (WP#) signal 26 is used to protect the device from accidental programming or erasing. The internal voltage regulator (high voltage generator 32) is reset when WP# is Low. This signal is usually used for protecting the data during the power-on/off sequence when input signals are invalid.

Ready/Busy (R/B#) 14 is an open drain pin and the output signal is used to indicate the operating condition of the device. The R/B# signal is in Busy state (R/B#=L) during the Program, Erase and Read operations and will return to Ready state (R/B#=H) after completion of the operation.

Vcc 10 and Vss 12 are power supply inputs.

The memory core of NAND flash consists of NAND memory cell array 50, row decoder 52, sense amp & page buffer 54 and column decoder 56. The detailed memory cell array organization is described below. A page for either read or program operation is selected by the row decoder 52. A block for erase operation is also selected by the row decoder. During read operation, the data of the selected page is sensed and latched into sense amp & page buffer 54. After that, the data stored in the page buffer 54 are sequentially read out through column decoder 56 and global buffers 44. During programming, the input data from global buffers 44 are sequentially loaded into the page buffer 54 via column decoder 56. The input data latched in the page buffer are finally programmed into the selected page.

High voltage generator 32 provides high voltages and reference voltages during read, program and erase operations.

Global buffers 44 temporarily hold and buffer input and output data via common I/O pins (I/O 0 to 7) 28. The common I/O pins serve as the port for command, address and input/output data.

Status register 42 tracks the device status during read, program or erase operation.

Ready/Busy# 30 has an open drain transistor, and generates the Ready/Busy (R/B#) signal 14 referenced above.

Command register 38 decodes an input command from the global buffer 44 and the decoded command is input to the control circuit 36 having a state machine.

Control circuit 36 is a central unit to control the entire device during various operating modes.

Control buffers 34 determine one of operating modes such as command input, address input, data input, data output and status output in accordance with combination of control pins as CE#, CLE, ALE, WE#, RE# and WP#.

Multiplexed column address and row address are stored in the address register 40 and transferred into row pre decoder 46 and column decoder 56 via column pre decoder 48.

An example of operational timing details and device operations for the NAND flash functional block of FIG. 1 can be found in NAND Flash specifications such as Samsung's 8 Gb SLC NAND Flash Specification k9f8g08x0 m entitled "1 G×8 Bit/2 G×8 Bit NAND Flash Memory" dated Mar. 31, 2007 and Samsung's 16 Gb/32 Gb/64 Gb SLC NAND Flash Specification: k9xxg08uxm entitled "2 G×8 Bit/4 G×8 Bit/8 G×8 Bit NAND Flash Memory" dated Mar. 31, 2007, both of which are incorporated by reference herein.

Device Operation in NAND Flash

Figure 3:
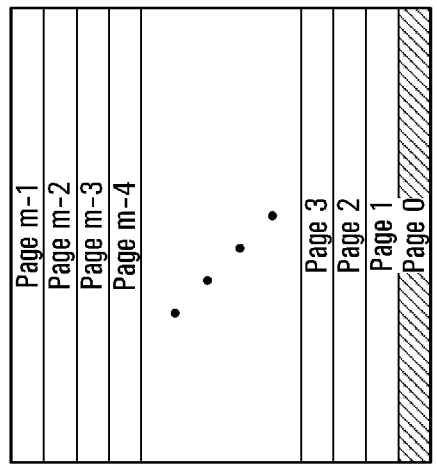
FIG. 3 illustrates a NAND flash block structure.
Figure 2:
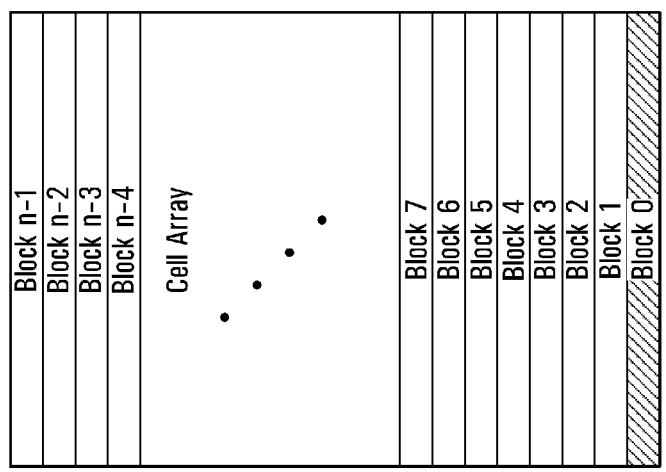
FIG. 2 illustrates a NAND flash cell array structure.

In this section, basic operations and cell array organization of NAND flash memory are described. FIG. 2 illustrates the cell array structure of NAND flash memory which consists of n erasable blocks labeled Block 0, Block 1, . . . , Block n−1. Each block is subdivided into m programmable pages as shown FIG. 3, labeled Page 0, Page 1, . . . , Page m−1.

Figure 4:
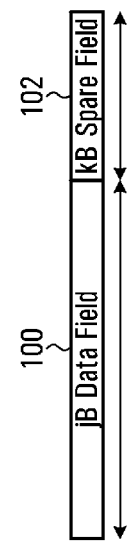
FIG. 4 illustrates a NAND flash page structure.

Each page consists of (j+k) bytes (×8 b) as shown in FIG. 4. The pages are further divided into a j-byte data storage region 100 (data field) with a separate k-byte area 102 (spare field). The k-byte area is typically used for error management functions. With this arrangement, 1 page=(j+k) bytes, 1 block=m pages=(j+k) bytes * m, and the total memory array size=n blocks=(j+k) bytes * m * n.

In NAND flash devices, read and program operations are executed on a page basis while erase operations are executed on a block basis. All operations may, for example, be driven by commands specified in the above-referenced Samsung specifications. In a specific example, j=4096, k=128, m=64 and n=2048. Using these numbers, 1 Page=(4K+128) Bytes, 1 Block=64 Pages=(4K+128) Bytes×64=(256K+8K) Bytes, 1 Plane=2048 Blocks=(256K+8K) Bytes×2048=(4 G+128M) Bits, and 1 Device=2 Planes=(4 G+128M) Bits * 2=(8 G+256M) Bits. Typically, the stated memory capacity in NAND flash does not include the spare field.

Figure 5:
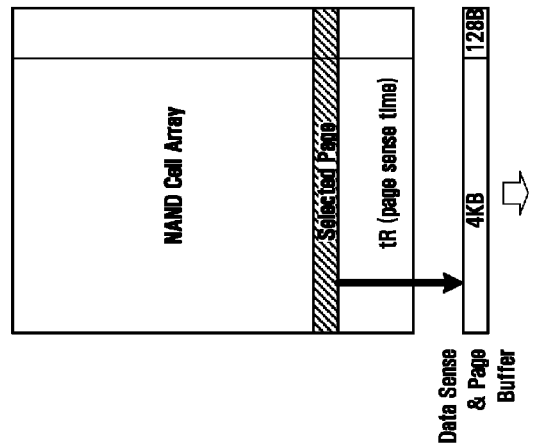
FIG. 5 illustrates a page basis read operation in NAND flash.

The internal memory array is accessed on a page basis. The read operation starts after writing READ command followed by addresses via common I/O pins (I/O0 to I/O 7) to the device. The 4,224 bytes of data within the selected page are sensed and transferred to the page register (or page buffer) in less than tR (data transfer time from flash array to page register) shown in FIG. 5. Once the 4,224 bytes of data are sensed and transferred from the selected page in the cell array to the data register, the data in the data register can be sequentially read from the device.

Figure 6:
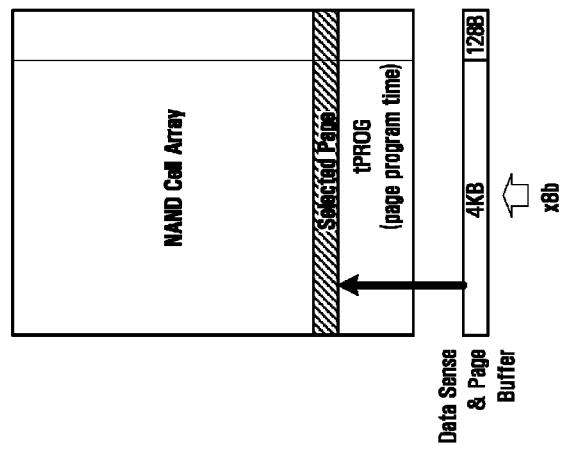
FIG. 6 illustrates a page basis program operation in NAND flash.

The memory array is programmed on a page basis. For program operations, a PROGRAM command followed by addresses and input data of 4,224 bytes is issued to the device through common I/O pins (I/O0 to I/O7). The 4,224 bytes of data are transferred to the page register (or page buffer) during input data loading cycles and finally programmed to the selected page of the cell array less than tPROG (page program time) as shown in FIG. 6.

Figure 7:
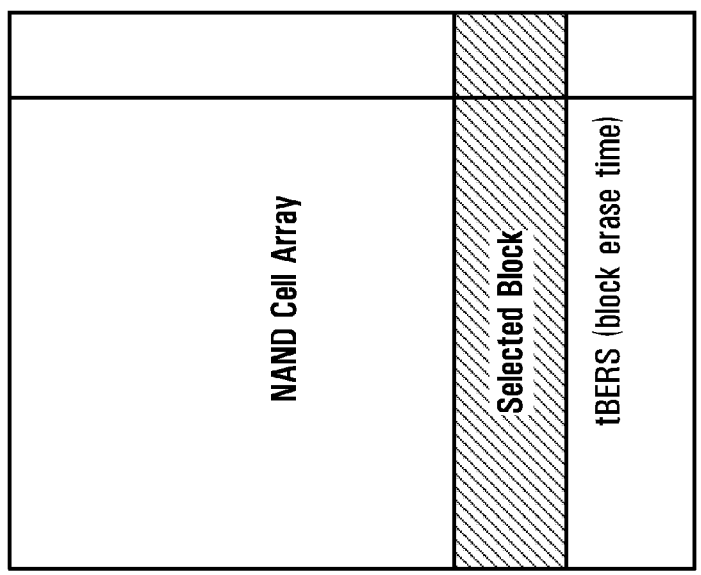
FIG. 7 illustrates a block basis erase operation in NAND flash.
Figure 8:
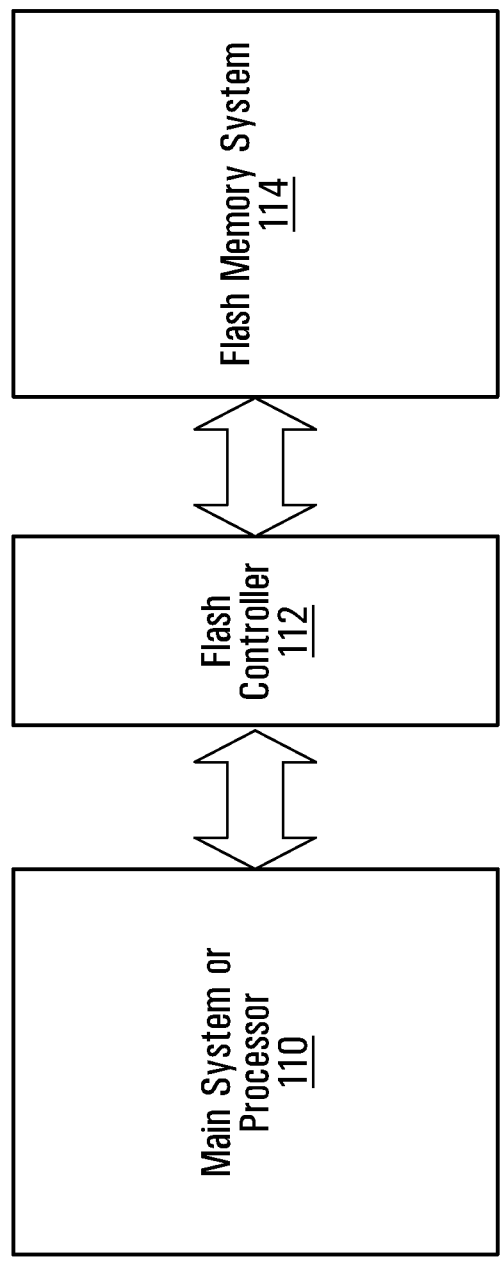
FIG. 8 illustrates a general system with flash memory.

The memory array is erased on a block basis. For block erase operations, a BLOCK ERASE command followed by block addresses is issued to the device through common I/O pins (I/O0 to 1/O7). The (256K+8K) bytes of data are erased less than tBERS (block erase time) as shown in FIG. 7.
General Flash Memory System FIG. 8 shows a block diagram of an example of a general system that includes a flash memory system. The flash memory system 114 communicates with a main system or processor 110 via a flash controller 112.

Figure 9:
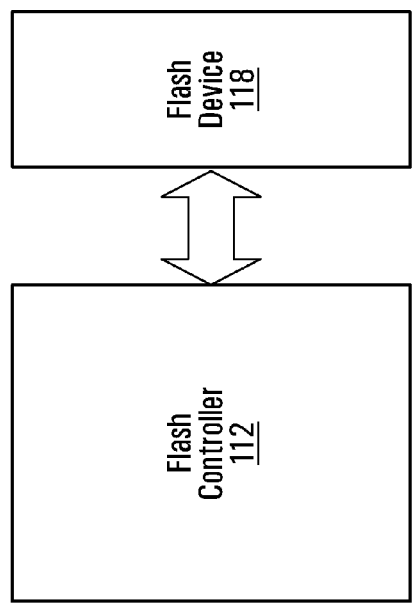
FIG. 9 illustrates a flash memory system using a single flash memory device.
Figure 10:
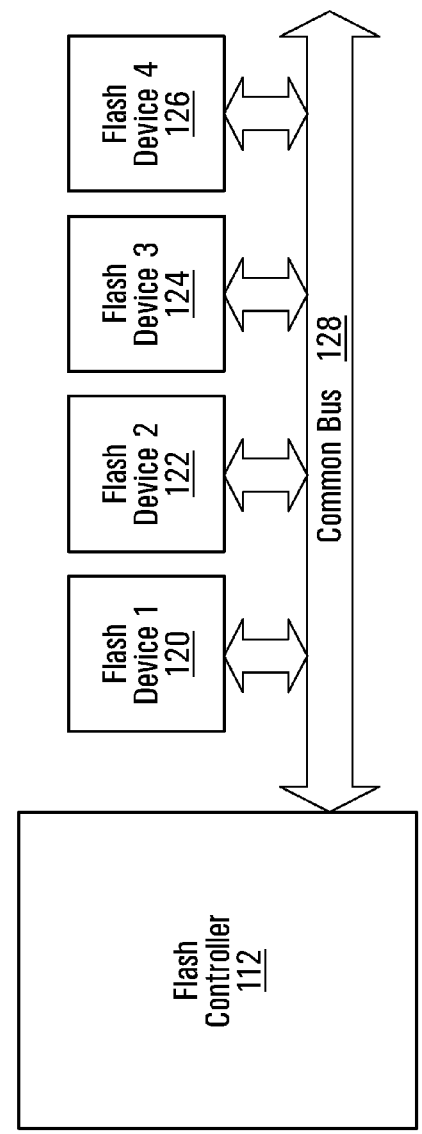
FIG. 10 illustrates a flash memory system using multiple flash memory devices.

A typical flash memory system has either a single flash memory device 118 as shown in FIG. 9 or multiple flash memory devices 120,122,124,126 as shown in FIG. 10. A flash memory system using a single flash device might be used in applications which require relatively small memory space.

For applications requiring large memory space, a flash memory system using multiple flash memory devices can be implemented such as the system of FIG. 10. The flash controller 112 can access each flash memory device 120,122,124, 126 via a common bus 128. Only one flash device can be selected at a time by asserting a chip enable signal on one of devices.
NAND Flash Memory in Multi Chip Package (MCP)

A multi chip package (MCP: multiple chips in a single package) is a very popular solution to increase packing density. An MCP typically uses multi-drop bus such as shown in FIG. 11 and FIG. 12.

Figure 11:
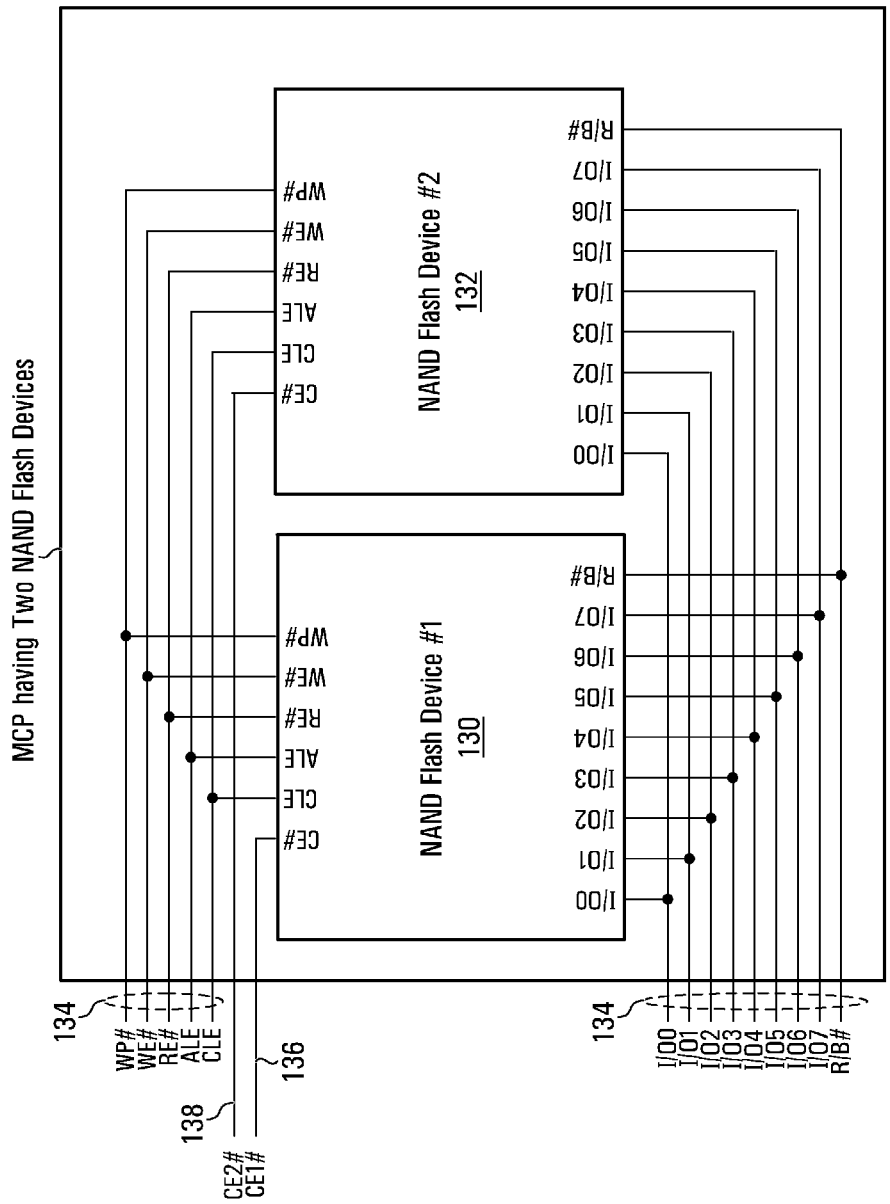
FIG. 11 illustrates NAND flash devices in multi-drop connection.

FIG. 11 illustrates a MCP having two NAND flash devices 130,132. All input and output signals except chip select (CE#) signals 136,138 in each flash memory device are connected to a common bus 134. Each flash memory device can be selected by asserting the appropriate CE# signal. For example, the flash device 1 130 can be selected and accessed by asserting CE1# 136 (CE1#="Low"). The 2nd flash device 132 is unselected (CE2#="High") and ignores any input like commands or addresses from the flash controller. Also the output signals of the rest devices are high impedance (i.e. Hi-Z) state.

Figure 12:
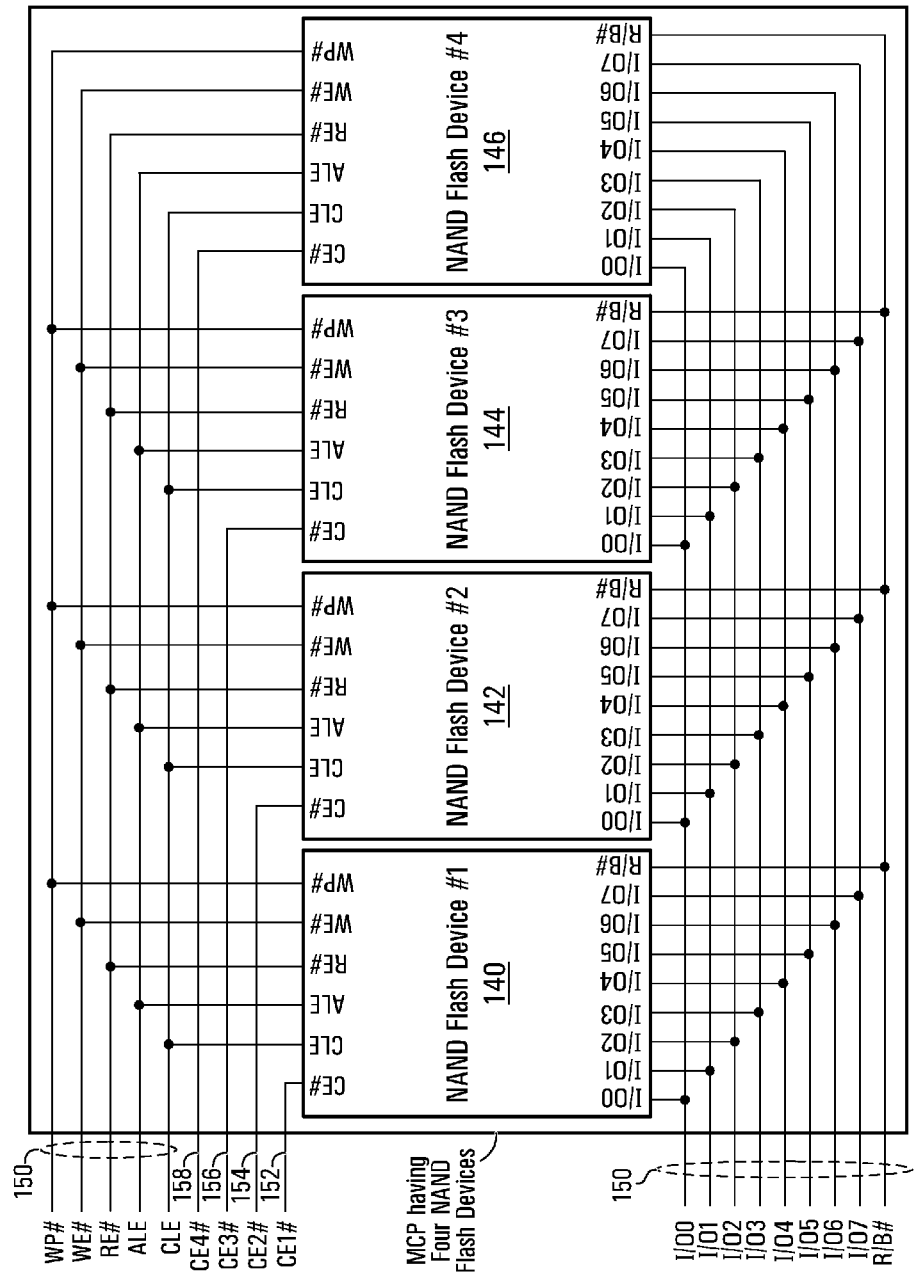
FIG. 12 illustrates NAND flash devices in multi-drop connection.

Similarly FIG. 12 illustrates a MCP having four NAND flash devices 140,142,144,146 with respective CE# signals CE1# 152, CE2# 154, CE3# 156, and CE4# 158. The 1st flash device 1 140 can be selected and accessed by asserting CE1# (CE1#="Low"). The rest of the devices are unselected (CE2#="High", CE3#="High", CE4#="High") and ignore any input like commands or addresses from the flash controller. Also the output signals of the rest devices are high impedance (i.e. Hi-Z) state. This type of device connection is a multi-drop bus connection or topology.

Figure 13:
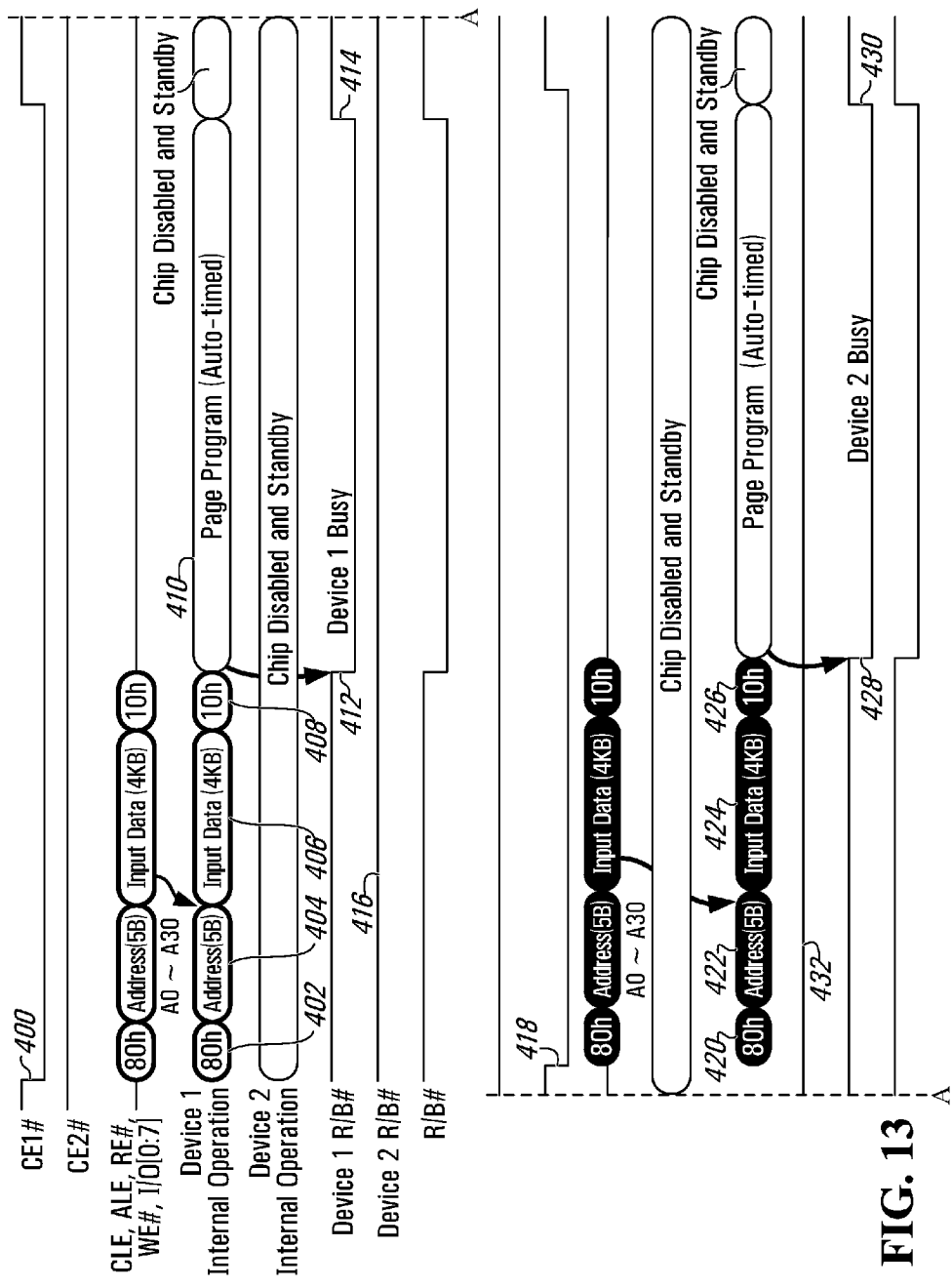
FIG. 13 illustrates a page program in two NAND flash devices.

FIG. 13 illustrates an example of page program operational timing for two NAND flash devices in a single package. All input and output pins except CE# pins are commonly connected in multi-drop configuration as shown in FIG. 11. This example shows consecutive program operations into device 1 130 and device 2 132.

When CE1# is Low (400), the 1st command cycle (80 h) for page program is issued (402) to device 1 130. Five bytes input addresses (A0 to A30 for 8 Gb NAND Flash) (404) and 4K bytes input data (406) are loaded to device 1.

The 2nd command cycle (10 h) (408) for page program is asserted and device 1 starts page program operation (410) governed by auto-timed, internal program algorithm. During this period, the R/B# of device 1 goes Low to represent device 1 is in busy state (412). Once the internal page program operation is completed, the R/B# of device 1 goes High (414). Hence the next command can be issued to device 1. During page program operation in device 1, device 2 132 is disabled (deselected) by CE2#=High (416).

When CE2# is Low (418), the 1st command cycle (80 h) for page program is issued to device 2 (420). Five bytes input addresses (AO to A30 for 8 Gb NAND Flash) (422) and 4K bytes input data (424) are loaded to device 2. The 2nd command cycle (10 h) (426) for page program is asserted and device 1 starts page program operation governed by auto-timed, internal program algorithm. During this period, the R/B# of device 1 goes Low (428) to represent device 1 is in busy state. Once the internal page program operation is completed, the R/B# of device 2 goes High (430). Hence the next command can be issued to device 2. During page program operation in device 2, device 1 is disabled (deselected) by CE2#=High (432).

With page program operations shown in FIG. 13, the unselected NAND flash device waits until the selected device completes any operation. The auto-timed page program typically takes 200 us in SLC NAND flash and 600 us in MLC NAND flash.

Figure 14:
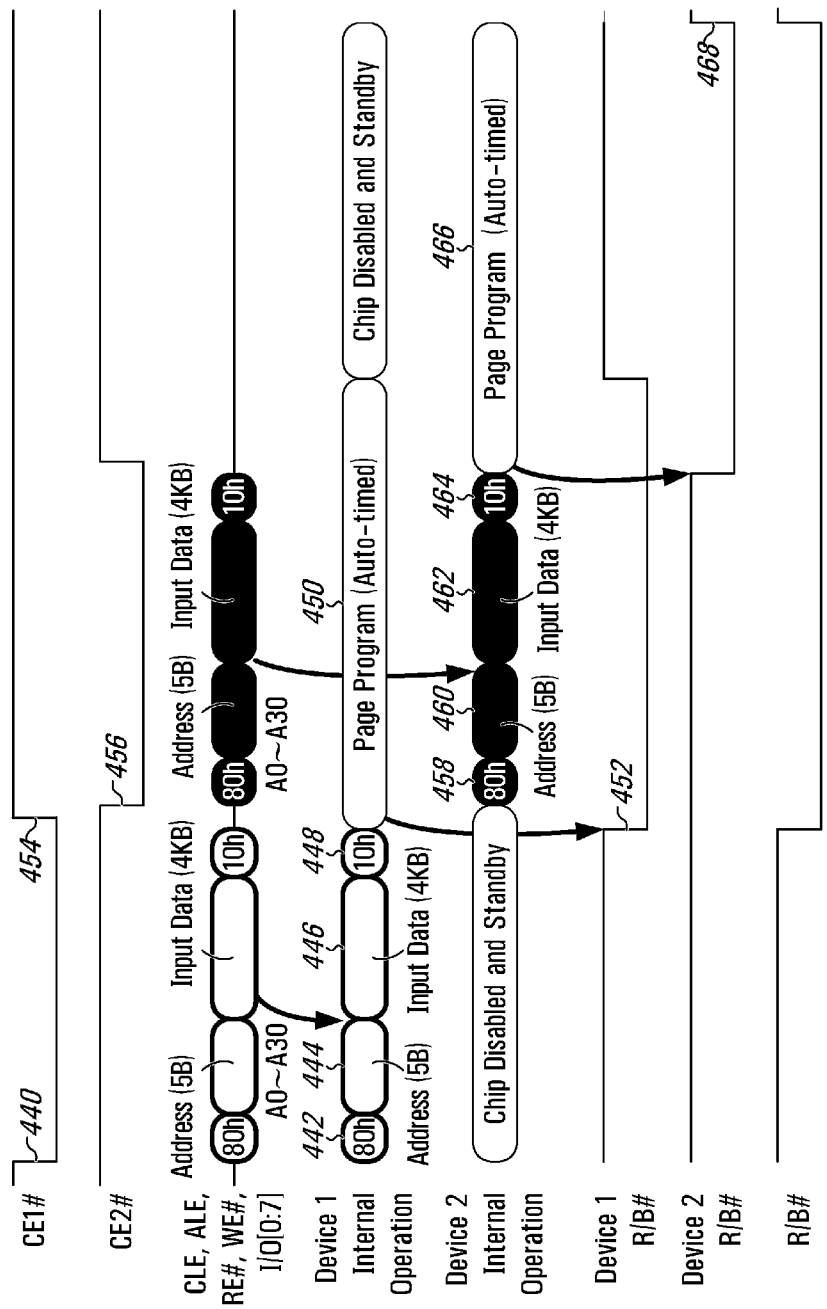
FIG. 14 illustrates an interleave page program in two NAND flash devices.

In order to reduce the waiting time, a NAND flash device may have a "CE# don't care state." Once the selected device starts an internal page program operation, the selected device will continue the internal page program operation even when the CE# is High. With the "CE# don't care" feature, the next device can perform any other operation once the previous device enters the internal page program operation. This is referred to as a device interleave operation between two NAND flash devices and an example of this is shown in FIG. 14, again in the context of the MCP of FIG. 11 containing 2 flash devices.

When CE1# is Low (440), the 1st command cycle (80 h) for page program is issued to device 1 130 (442). Five bytes input addresses (A0 to A30 for 8 Gb NAND Flash) (444) and 4K bytes input data (446) are loaded to device 1. The 2nd command cycle (10 h) (448) for page program is asserted and device 1 starts page program operation governed by auto-timed, internal program algorithm (450). During this period, the R/B# of device 1 goes 'Low' to represent device 1 is in busy state (452). Once the internal page program operation in the 1st device started, which can be indicated by R/B#, the CE1# can return to High (454). Therefore the next page program command can be issued to the 2nd device 132.

When CE2# is Low (456), the 1st command cycle (80h) for page program to device 2 is issued (458). Five bytes input addresses (A0 to A30 for 8 Gb NAND Flash) (460) and 4K bytes input data (462) are loaded to device 2. The 2nd command cycle (10 h) (464) for page program is asserted and device 2 starts page program operation governed by auto-timed, internal program algorithm (466). Once the internal page program operation is completed, the R/B# of device 2 goes High (468).

Figure 15:
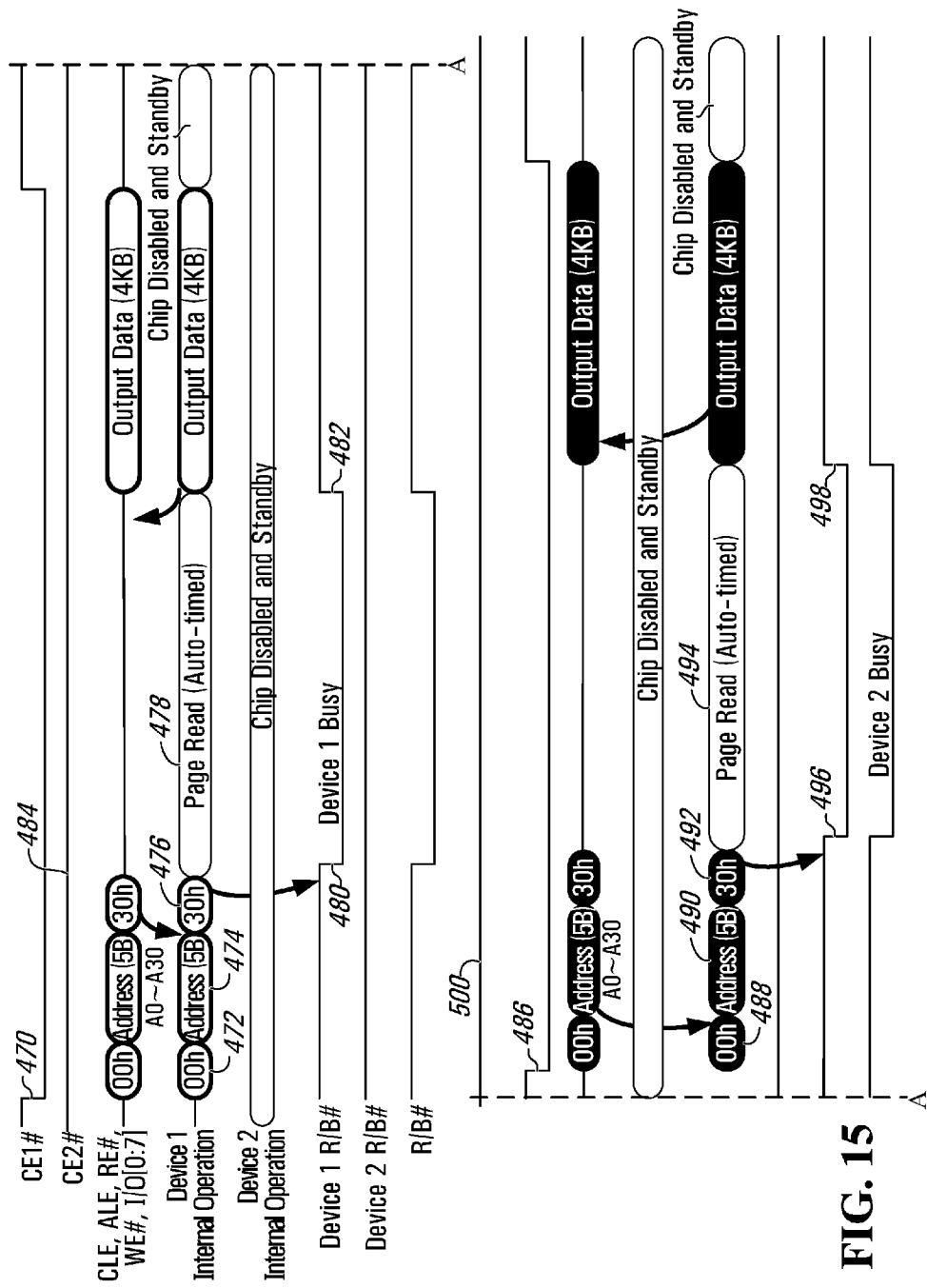
FIG. 15 illustrates a page read in two NAND flash devices.

FIG. 15 shows interleave page read operational timing for two NAND flash devices in a single package, for example, the MCP of FIG. 11. The interleave page read operation is very similar to the interleave page program operation described previously. When CE1# is Low (470), the 1st command cycle (00 h) (472) for page read to device 1 130 is issued and five bytes input addresses (A0 to A30 for 8 Gb NAND Flash) (474) are loaded to device 1. The 2nd command cycle (30 h) (476) for page read is asserted and device 1 starts page read operation governed by auto-timed, internal read algorithm. During this period, the R/B# of device 1 goes Low to represent device 1 is in busy state (480). Once the internal page read operation is completed, the R/B# of device 1 goes High (482). Hence device 1 is ready for burst read operation of 4 KB data. During page read operation for device 1, device 2 132 is disabled (deselected) by CE2#=High (484).

When CE2# is Low (486), the 1st command cycle (00 h) (488) for page program to device 2 is issued and five bytes input addresses (A0 to A30 for 8 Gb NAND Flash) (490) are loaded to device 2. The 2nd command cycle (10 h) (492) for page read is asserted and device 2 starts page read operation governed by auto-timed, read algorithm (494). During this period, the R/B# of device 2 goes Low to represent device 2 is in busy state (496). Once the internal page read operation is completed, the R/B# of device 2 goes High (498). Hence the next command can be issued to device 2. During page read operation for device 2, device 1 is disabled (deselected) by CE2#=High (500).

In MCP Configuration

An objective of MCP in flash memory is increasing memory capacity while maintaining same package pinout and configuration. However, in conventional implementations the chip enable (CE#) pin needs to be separated as described in section 1.4. If the MCP device has 4 flash devices in a single package, four chip enable pins (CE1#~CE4#) are needed as opposed to two in an MCP with two flash devices. The result is that the 4-device MCP needs a different pin assignment and PCB layout compared to a 2-device MCP. In addition, this chip enable pin increase is a burden to the flash memory controller.

The embodiments described below use only two flash devices in a single package or flash memory system. However, these embodiments are easily extended to be applicable to larger numbers of flash devices in a single package or flash memory system.

Device Selection by Command in MCP

Figure 16:
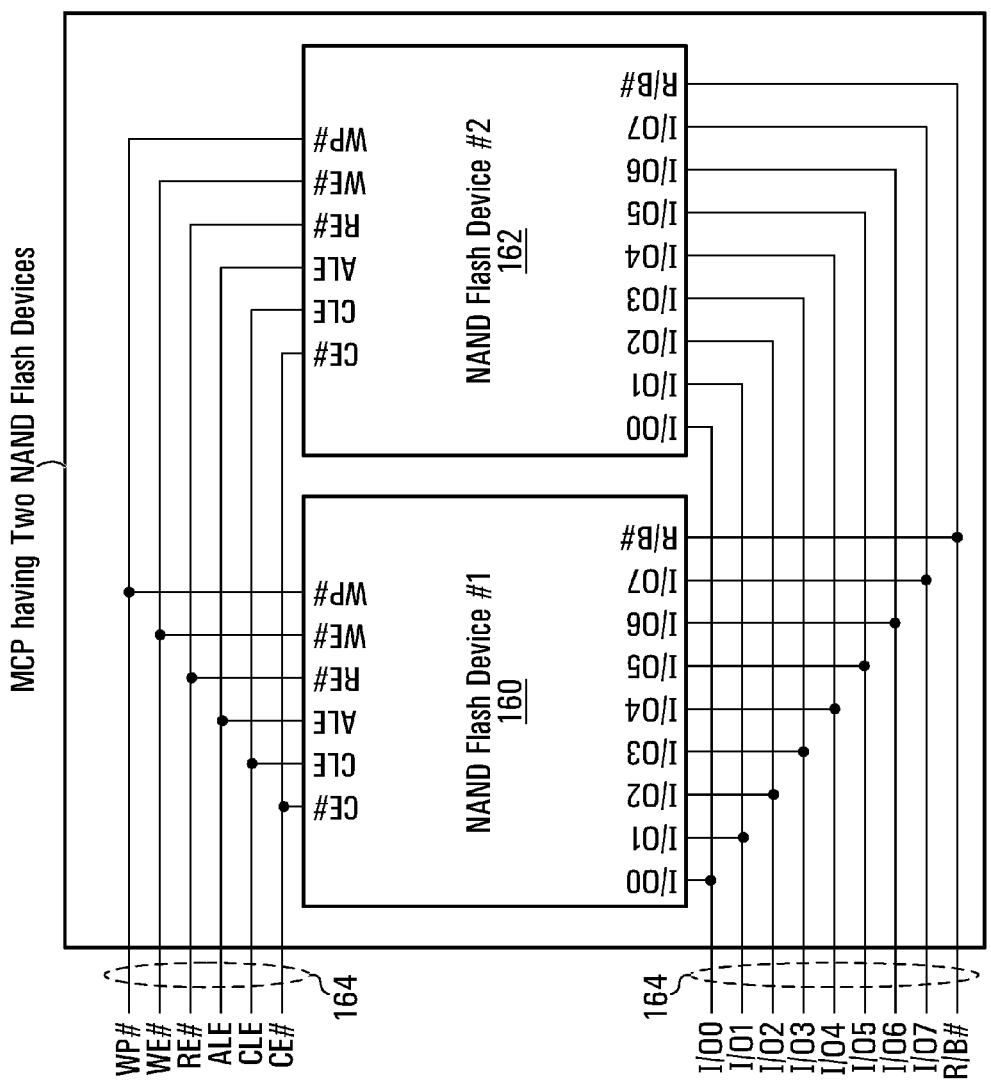
FIG. 16 illustrates two NAND flash devices in a MCP according to one embodiment of the present invention.
Figure 17:
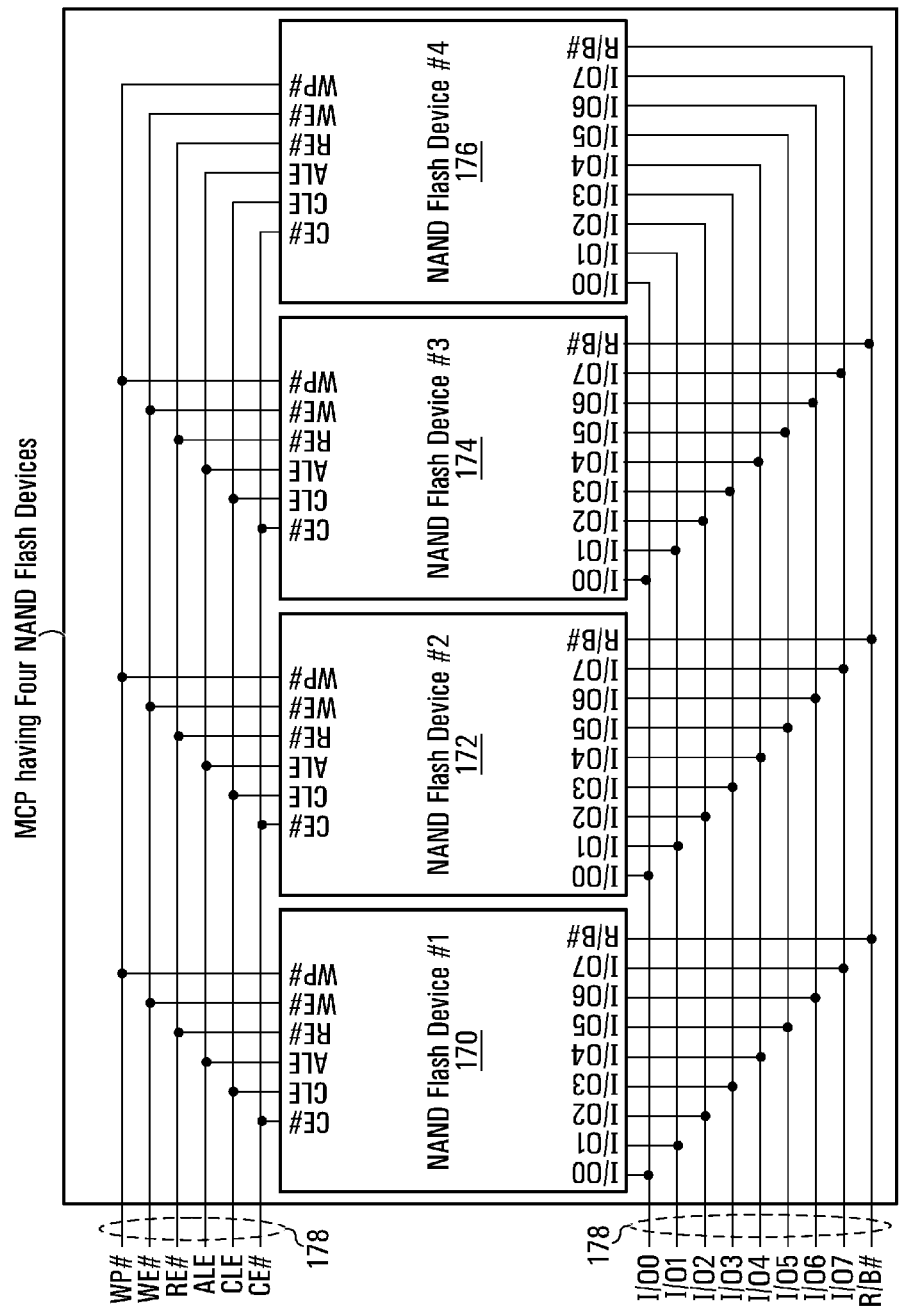
FIG. 17 illustrates four NAND flash devices in a MCP according to another embodiment of the present invention.

FIG. 16 and FIG. 17 show examples of device connection for two NAND flash devices in a single package and four NAND flash devices in a single package. For the two device embodiment of FIG. 16, there are two NAND flash devices 160,162 connected to a common bus 164. Unlike the arrangement of FIG. 11, there are no individual CE# pins. Similarly, for the four device embodiment of FIG. 17, there are four NAND flash devices 170,172,174,176 connected to a common bus 178. Unlike the arrangement of FIG. 12, there are no individual CE# pins. In the illustrated examples, the pinout is identical regardless of the number of flash memory devices in a package and all pins are commonly connected.

Figure 18:
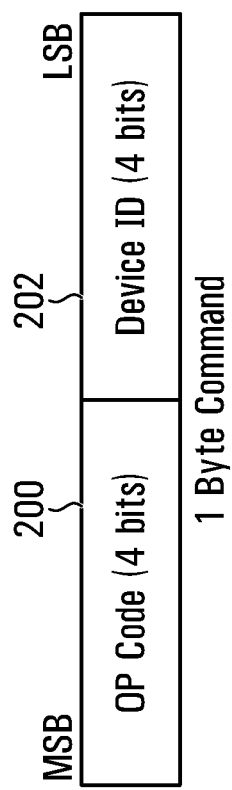
FIG. 18 illustrates a command structure according to another embodiment of the present invention.

Some conventional NAND flash systems use a one byte command structure. No device ID is included in the command structure. FIG. 18 depicts a 1 byte command structure according to an embodiment of the present invention. The command consists of OP code 200 and device ID 202. In this example, upper 4 bits (Bit 4 to Bit 7) are assigned to the OP code and lower 4 bits (Bit 0 to Bit 3) are assigned to the device ID. With 4-bit device ID, total 16 devices can be exclusively selected. Note that the number of bits assigned to OP code and device ID may vary and the command structure shown in FIG. 18 is just an example.

In some embodiments, each NAND flash device connected in a multi-drop configuration, for example the NAND flash devices of FIG. 16 or 17, contains a command processor (not shown) configured to process a command received via the common bus to determine if the command selects that particular memory device, and to act upon the command if the command selects that particular memory device.

Table 1 lists an example set of commands for use in an embodiment of the present invention. The lower 4 bits in the 1st command select one of up to 16 flash devices. A difference between the proposed NAND flash command and conventional NAND flash commands is that the lower 4 bits of each command in the example of the present invention are assigned to the device ID.

TABLE 1

Example Set of Commands Including Device ID

| Function | 1st Command Cycle | 2nd Command Cycle |
| --- | --- | --- |
| Read | 0X h | 30 h |
| Burst Read (Additional Command) | 2X h | 30 h |
| Block Erase | 6X h | D0 h |
| Read Status | 7X h | — |
| Page Program | 8X h | 10 h |

X = Device ID: 0~F up to 16 devices

Table 2 and Table 3 show read commands and page program commands having device ID to select one of up to 16 flash devices.

TABLE 2

Read Command having Device ID

| Function | 1st Command Cycle | 2nd Command Cycle |
| --- | --- | --- |
| Read Device 1 | 00 h | 30 h |
| Read Device 2 | 01 h | 30 h |
| Read Device 3 | 02 h | 30 h |
| ... | ... | ... |
| Read Device 16 | 0F h | 30 h |

TABLE 3

Page Program Command having Device ID

| Function | 1st Command Cycle | 2nd Command Cycle |
| --- | --- | --- |
| Page Program Device 1 | 80 h | 10 h |
| Page Program Device 2 | 81 h | 10 h |
| Page Program Device 3 | 82 h | 10 h |
| ... | ... | ... |
| Page Program Device 16 | 8F h | 10 h |

Figure 19:
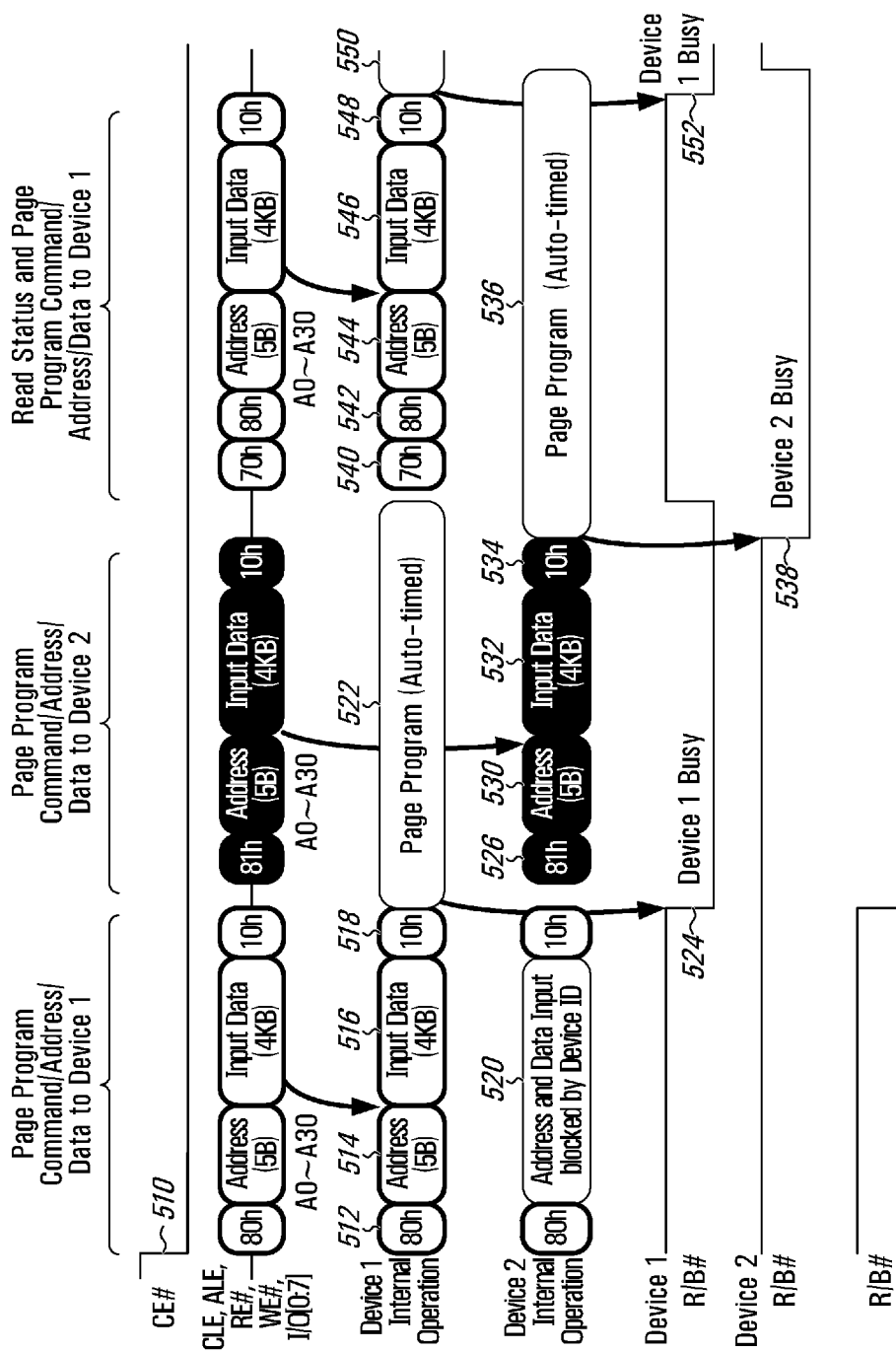
FIG. 19 illustrates an interleave page program in two NAND flash devices according to another embodiment of the present invention.

FIG. 19 illustrates operational timing of interleave page program in two NAND flash devices according to an embodiment of the present invention. Note that the following interleave page operations can be also applied to more than two flash devices in a system.

All flash devices (in this case, two flash devices) always accept any command. When CE# is Low (510), the 1st command cycle having device ID (80 h) (512) for page program is issued to device 1. Five bytes input addresses (A0 to A30 for 8 Gb NAND Flash) (514) and 4K bytes input data (516) are loaded to device 1, where:

1st address input (1st byte)=column address 1;

2nd address input (2nd byte)=column address 2;

3rd address input (3rd byte)=row address 1;

4th address input (4th byte)=row address 2;

5th address input (5th byte)=row address 3.

Device 2 will recognize from the 1st command cycle (80 h) that the input address and input data are not for device 2. Thus device 2 will block following 5 bytes input address and 4K bytes input data from the common bus (i.e. device 2 is deselected by the 1st command cycle (80 h)) (520). The 2nd command cycle (10 h) (518) for page program is asserted and device 1 starts page program operation governed by auto-timed, internal program algorithm (522). During this period, the R/B# of device 1 goes Low to represent device 1 is in busy state (524) Device 2 will ignore the 2nd command cycle (10 h) because the 1st command cycle (80 h) was not for device 2. Once the internal page program operation in device 1 started, which can be indicated by R/B#, the next page program command can be issued to device 2.

The 1st command cycle having device ID (81 h) (526) for page program to device 2 is issued to device 2. Five bytes input addresses (A0 to A30 for 8 Gb NAND Flash) (530) and 4K bytes input data (532) are loaded to device 1. The internal page program operation in device 1 is not interrupted by the 1st command cycle (81 h) for page program to device 2. The 2nd command cycle (10 h) (534) for page program is asserted and device 2 starts page program operation governed by auto-timed, internal program algorithm (536). During this period, the R/B# of device 2 goes Low to represent device 2 is in busy state (538).

A read status command having device ID (70 h) is issued to check the status of device 1 (540). If device 1 is ready to take a next operation, another page program command can be inputted to device 1. The 1st command cycle having device ID (80 h) (542) for page program is issued to device 1. Five bytes input addresses (A0 to A30 for 8 Gb NAND Flash) (544) and 4K bytes input data (546) are loaded to device 1. The 2nd command cycle (10 h) (548) for page program is issued and device 1 starts page program operation governed by auto-timed, internal program algorithm (550). During this period, the R/B# of device 1 goes Low to represent device 1 is in busy state (552).

Figure 20:
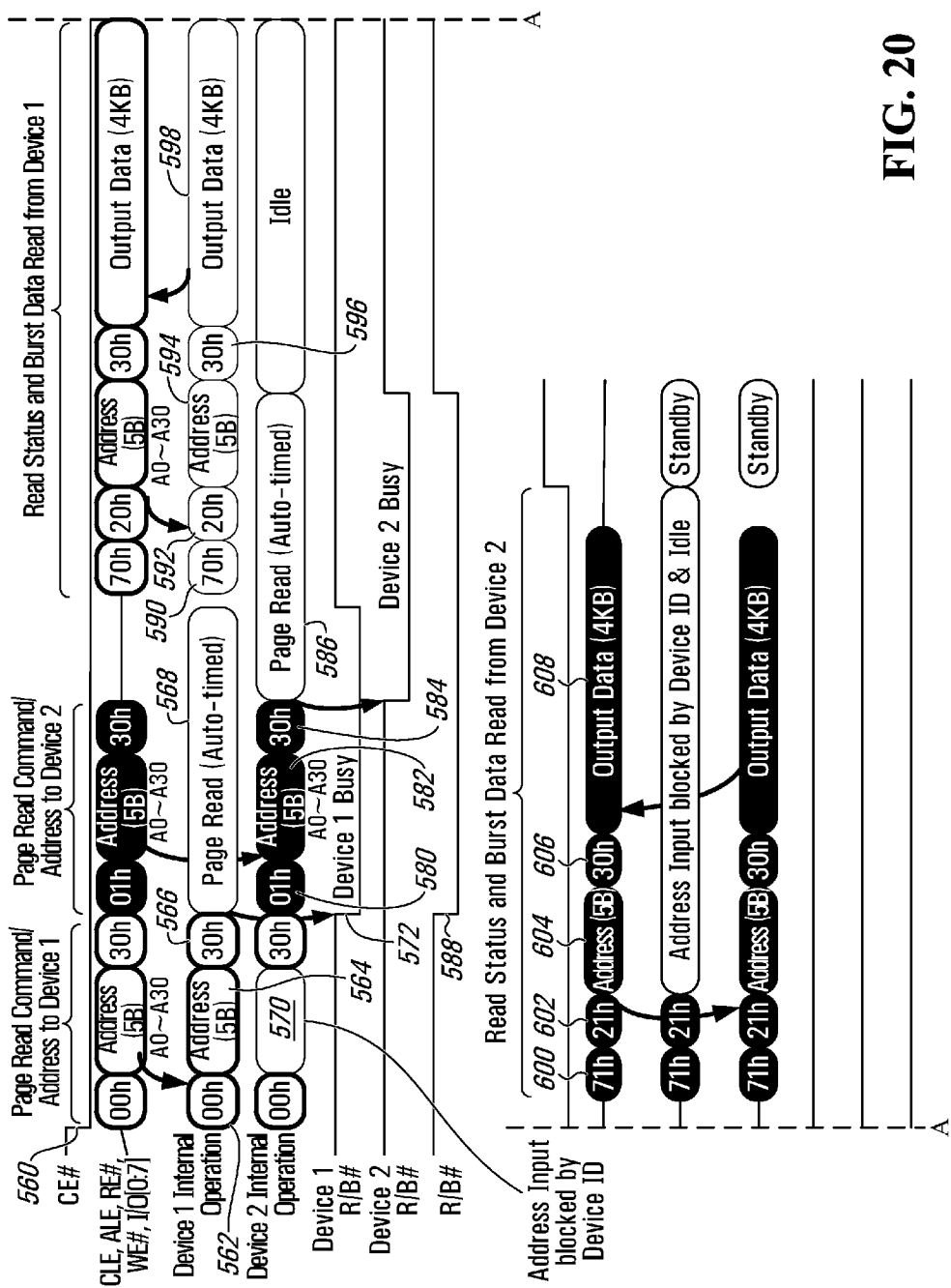
FIG. 20 illustrates an interleave page read in two NAND flash devices according to another embodiment of the present invention.

FIG. 20 illustrates operational timing of interleave page read in two NAND flash devices according to an embodiment of the present invention. Note following interleave page operations can be also applied to more than two flash devices in a system.

All flash devices (in this case, two flash devices) always accept any command. When CE# is 'Low' (560), the 1st command cycle (00 h) (562) for page read to device 1 is asserted and five bytes input addresses (A0 to A30 for 8 Gb NAND Flash) (564) are loaded to device 1. Device 2 will recognize from the 1st command cycle (00 h) that the input address are not for device 2. Thus device 2 will block following 5 bytes input address from the common bus (i.e. device 2 is deselected by the 1st command cycle (00 h)) (570). The 2nd command cycle (30 h) (566) for page read is asserted and device 1 starts page read operation governed by auto-timed, internal read algorithm (568). During this period, the R/B# of device 1 goes Low to represent device 1 is in busy state (572). Device 2 will ignore the 2nd command cycle (30 h) because the 1st command cycle having device ID (00 h) is not for device 2.

The 1st command cycle (01 h) (580) for page read to device 2 is asserted and five bytes input addresses (A0 to A30 for 8 Gb NAND Flash) (582) are loaded to device 2. The 2nd command cycle (30 h) (584) for page read is asserted and device 2 starts page read operation governed by auto-timed, read algorithm (586). During this period, the R/B# of device 2 goes Low to represent device 2 is in busy state (588).

A read status command having device ID (70 h) is issued to device 1 to check the device status (590). If device 1 is ready to take a next operation, another command can be inputted to device 1. The 1st command cycle (20 h) (592) for burst read to device 1 is asserted and five bytes input addresses (A0 to A30 for 8 Gb NAND Flash) (594) are loaded to device 2. The 2nd command cycle (30 h) (596) for burst read is asserted and device 1 starts burst read operation to access 4K bytes data stored in the page buffers of device 1 during previous page read operation in device 1 (598).

After burst reading the data from device 1, a read status command (71 h) is issued to check the status of device 2 (600). Device 1 will ignore the read status command (71 h) because this command is not for the device 1. If device 2 is ready to take a next operation, another command can be inputted to device 2. The 1st command cycle (21 h) (602) for burst read to device 2 is asserted and five bytes input addresses (604) are loaded to device 2. The 2nd command cycle (30 h) (606) for burst read is asserted and device 2 starts burst read operation to access 4K bytes data stored in the page buffers of device 2 during previous page read operation in device 2 (608).

Figure 21:
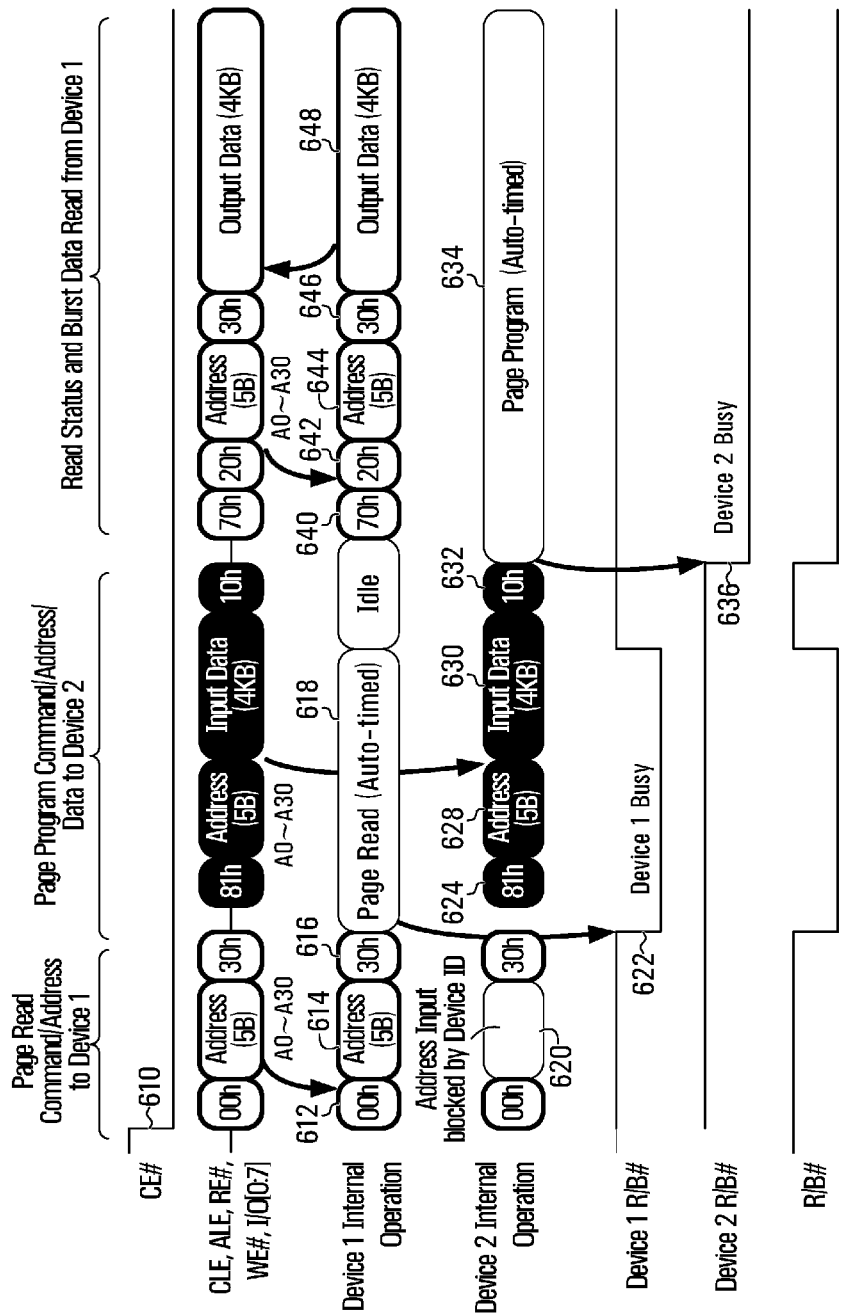
FIG. 21 illustrates an interleave page read and program in two NAND flash devices according to another embodiment of the present invention.

Similarly any device interleave operation among read, program and block erase can be executed with an embodiment of the present invention. FIG. 21 shows operational timing of interleave page read and program in two NAND flash devices according to an embodiment of the present invention.

All flash devices (in this case, two flash devices) always accept any command. When CE# is Low (610), the 1st command cycle (00 h) (612) for page read to device 1 is asserted and five bytes input addresses (A0 to A30 for 8 Gb NAND Flash) (614) are loaded to device 1. Device 2 will recognize from the 1st command cycle (00 h) that the input address are not for device 2. Thus device 2 will block following 5 bytes input address from the common bus (i.e. device 2 is deselected by the 1st command cycle (00 h)) (620). The 2nd command cycle (30 h) (616) for page read is asserted and device 1 starts page read operation governed by auto-timed, internal read algorithm (618). During this period, the R/B# of device 1 goes Low to represent device 1 is in busy state (622). Device 2 will ignore the 2nd command cycle (30 h) because the 1st command cycle (00 h) is not device 2.

The 1st command cycle having device ID (81 h) (624) for page program to device 2 is issued to device 2. Five bytes input addresses (A0 to A30 for 8 Gb NAND Flash) (628) and 4K bytes (630) input data are loaded to device 1. The internal page program operation in device 1 is not interrupted by the 1st command cycle (81 h) for page program to device 2. The 2nd command cycle (10 h) (632) for page program is asserted and device 2 starts page program operation governed by auto-timed, internal program algorithm (634). During this period, the R/B# of device 2 goes Low to represent device 2 is in busy state (636).

A read status command (70 h) is issued to check the status of device 1 (640). If device 1 is ready to take a next operation, another command can be inputted to device 1. The 1st command cycle (20 h) (642) for burst read to device 1 is asserted and five bytes input addresses (644) are loaded to device 1. The 2nd command cycle (30 h) (646) for burst read is asserted and device 1 starts burst read operation to access 4K bytes data stored in the page buffers of device 1 during previous page read operation in device 1 (648).

Device Selection by Input Address in MCP

In another embodiment, device selection is achieved through the use of input address, for example one or more MSB of the row address. The command and sequence shown in Table 4 are identical to those of conventional proposed NAND flash. It should be clearly understood a different command structure could be used.

TABLE 4

Example Command Set

| Function | 1st Command Cycle | 2nd Command Cycle |
|---|---|---|
| Read | 00 h | 30 h |
| Burst Read (Additional Command) | 20 h | 30 h |
| Block Erase | 60 h | D0 h |
| Read Status | 70 h | — |
| Page Program | 80 h | 10 h |
| Reset | FF h | — |

In addition to the command, a full command cycle for read, burst read, block erase, page program includes an address. In the conventional 8 GB NAND flash design, the address contains 4 bytes, containing 32 bits A0 to A31. Address bits A0 to A12 are assigned to the column address, and address bits A13 to A30 are assigned to the row address.

According to an embodiment of the invention, additional bits in of the address are used to select one of multiple devices that are commonly connected in a single package (e.g. MCP using multi-drop connection).

In a first example, for two 8 Gb flash devices, A31 can be used to perform device selection.

In a second example, for four 8 Gb flash devices, A31 and A32 can be used to perform device selection. Note this requires an additional byte in the address to convey A32. However, since the command and address are conveyed to the devices in sequence over the common bus, this does not change the pinout requirement.

In a second example, for eight 8 Gb flash devices, A31 to A33 can be used to perform device selection. Note that this also requires an additional byte in the address to convey A32 and A33. However, since the command and address are conveyed to the devices in sequence over the common bus, this does not change the pinout requirement.

Note that in addition to including address information for read, burst read, block erase, and page program, for this embodiment of the invention, address information is also included for other device-specific commands, such as read status.

Figure 22:
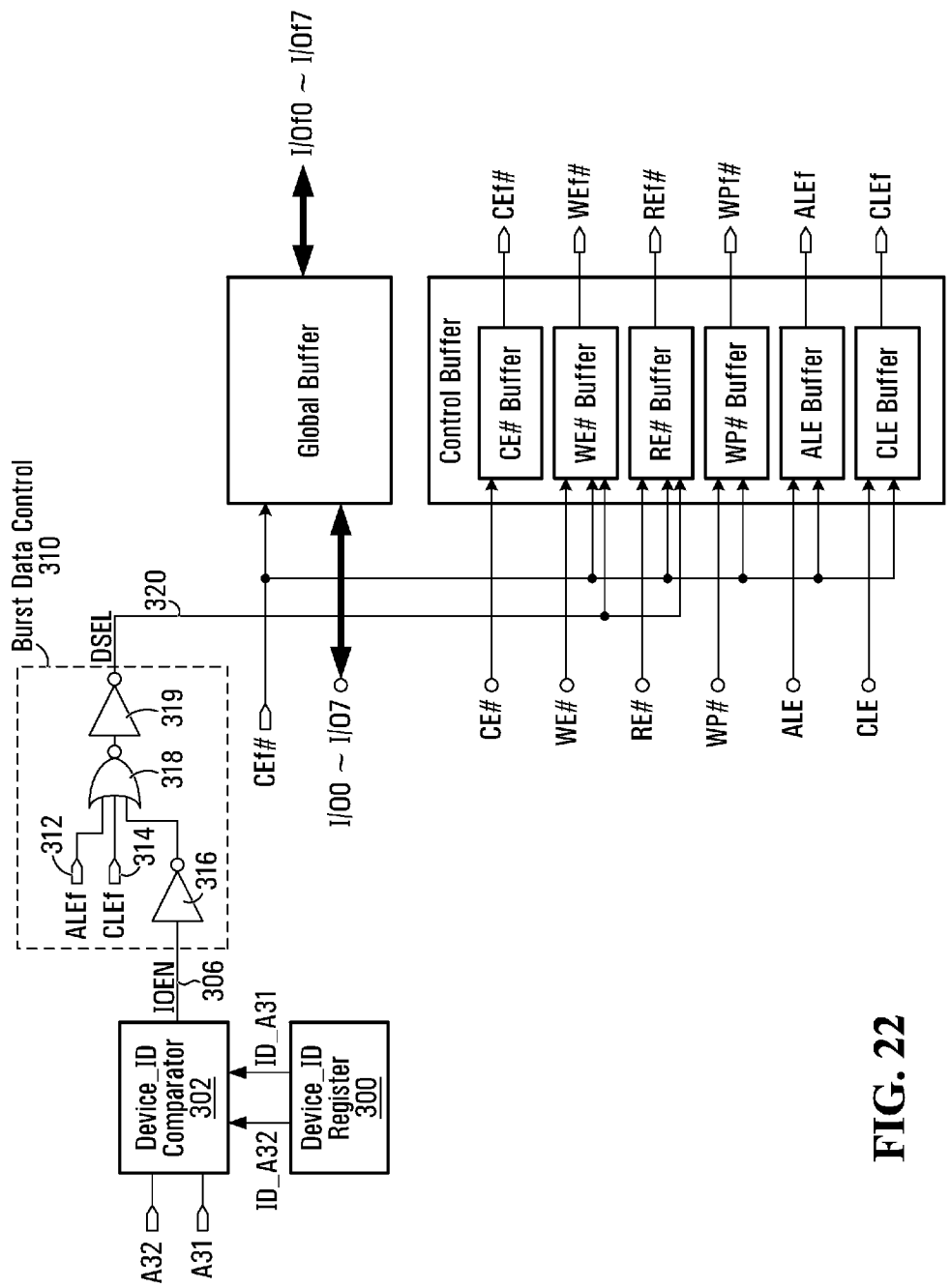
FIG. 22 illustrates example circuits for device selection by input address.

To explain the device selection (e.g., input and output data control) by input address, the case of 4 flash devices in MCP is described. FIG. 22 shows one example of circuits for device selection by input address. Such a circuit is included in each NAND flash device connected in a multi-drop configuration.

Refer to FIG. 1 for an example functional block diagram of a whole NAND flash. In FIG. 22, # denotes enable when logic Low (i.e. active when Low). CE#, WE#, RE#, WP#, ALE, CLE are external control input signals. CEf#, WEf#, REf#, WPf#, ALEf, CLEf are buffered, internal control signals. I/O0~I/O7 are external input and output signals (common I/O signals). I/Of0~I/Of7 are buffered, internal input and output signals. A31 and A32 are address signals from the address register. Device_ID register 300 is a register containing a unique device_ID—that is, unique between the devices connected in the multi-drop configuration. This can, for example, where the Device_ID register of each device contains respective values for the bits ID_A32 and ID_A31. be programmed by one of nonvolatile programming methods such as laser fuse, electrical fuse, pad bonding option, metal layer option or nonvolatile memory cells. An example of unique device ID information stored in Device_ID register of the four devices of an MCP is shown in Table 5 below.

The device ID in each flash device in MCP is compared with input address A31 and A32 whenever input addresses are loaded. Input address A31 and A32 via the global buffer are compared with device ID address ID_A31 and ID_A32 in Device ID Comparator 302. If the input addresses are matched with the device ID addresses, the output IOEN 306 of the Device_ID Comparator is High. WE# buffer and RE# buffer are controlled by not only CE# but also DSEL of the Burst Data Control block. Specifically, when DSEL is high, these buffers are disabled.

A burst data control block 310 generates the DSEL outputs 320 as a function of IOEN 306, ALEf 312 and CLEf 314. The burst data control block 310 receives IOEN 306, and inverts this with invertor 316 to produce IOEN#. ALEf 312 is an input that is high during address input, and CLEf 314 is an input that is high during command input. ALEf 312, CLEf 314 and IOEN# are input to NOR gate 318 the output of which input to inverter 319, the output of which is the DSEL output 320. DSEL low means that a device is not de-selected, while DSEL high means a device is de-selected. It can be seen that during command input (CLEf=High) or address input (ALEf=High), the DSEL is always High. Therefore any command or address input to each device in MCP is not blocked by the Burst Data Control (i.e. DSEL=Low). In addition, the device that has a device ID match is not de-selected.

Table 5 shows device selection table by input address for four flash devices in MCP.

TABLE 5

Device Selection by Input Address

| | | | Input Address (A32, A31) from 5th Address Input Cycle | | | |
|---|---|---|---|---|---|---|
| | ID_A32 | ID_A31 | 0, 0 | 0, 1 | 1, 0 | 1, 1 |
| Device 1 | 0 | 0 | Selected | — | — | — |
| Device 2 | 0 | 1 | — | Selected | — | — |
| Device 3 | 1 | 0 | — | — | Selected | — |
| Device 4 | 1 | 1 | — | — | — | Selected |

Figure 23:
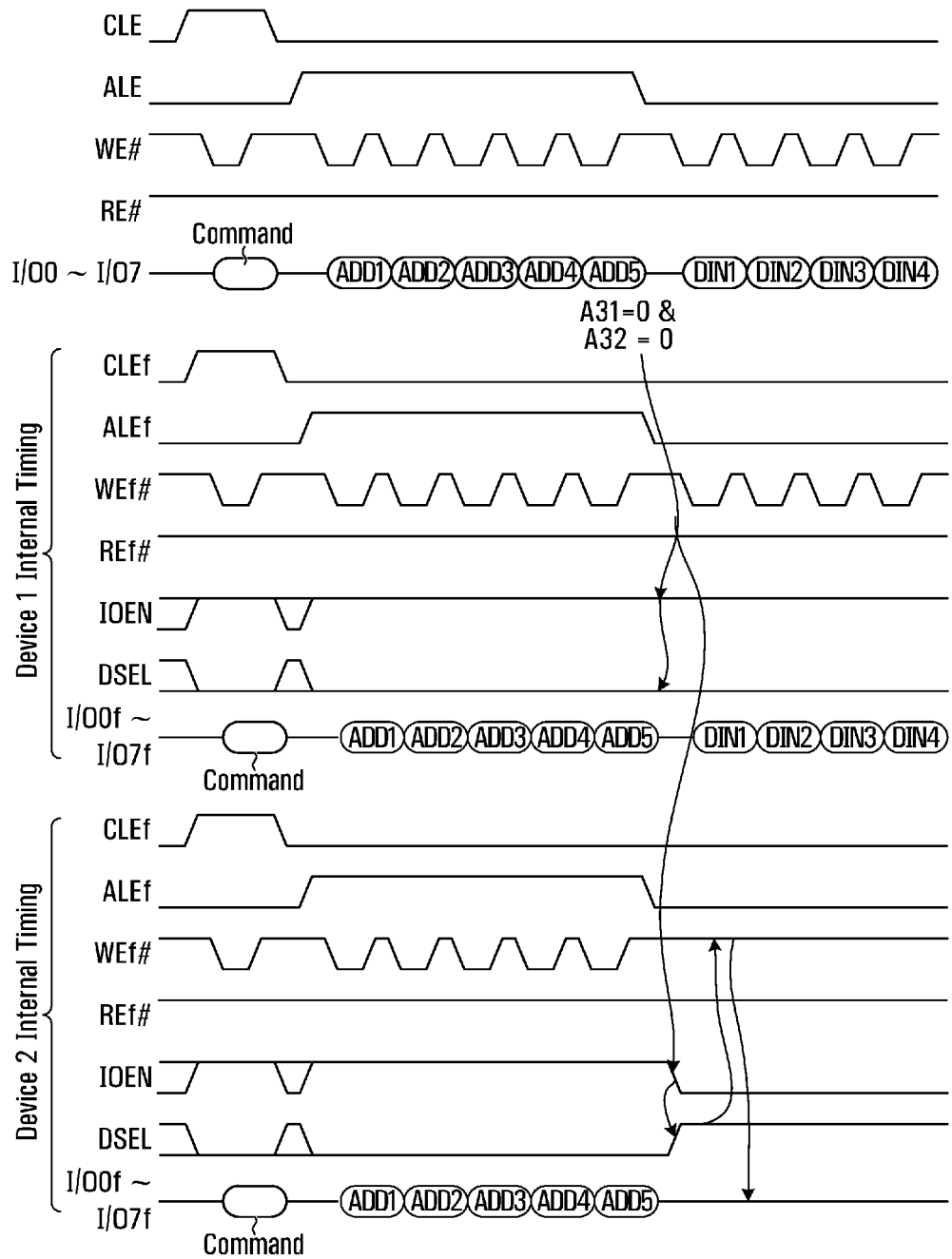
FIG. 23 illustrates a command/address/data input timing.

FIG. 23 illustrates an example of command/address/data input timing with the circuits shown in FIG. 22. Device 1 is selected and devices 2 to 4 are deselected. For operational timing in FIG. 23, only devices 1 and 2 are shown, but internal timing of devices 3 and 4 are identical to that of device 2. Input address A32 (=0) and A31 (=0) at the 5th address cycle are compared with device ID address ID_A31 and ID_A32 in the Device ID Comparator. The IOEN in device 1 is High while the IOEN in device 2 is Low. The DSEL in device 1 is Low (due to IOEN=High) and doesn't disable the WE# buffer. Therefore following 4K byte input data from external pins are inputted to the Device 1 during data input cycles. The DSEL in device 2 is High (due to IOEN=Low) and disables the WE# buffer. Therefore the buffered WEf# signal remains at 'High' and following 4K byte input data to the Device 2 are not inputted to device 1 during data input cycles. Devices 3 and 4 behave as device 2.

Figure 24:
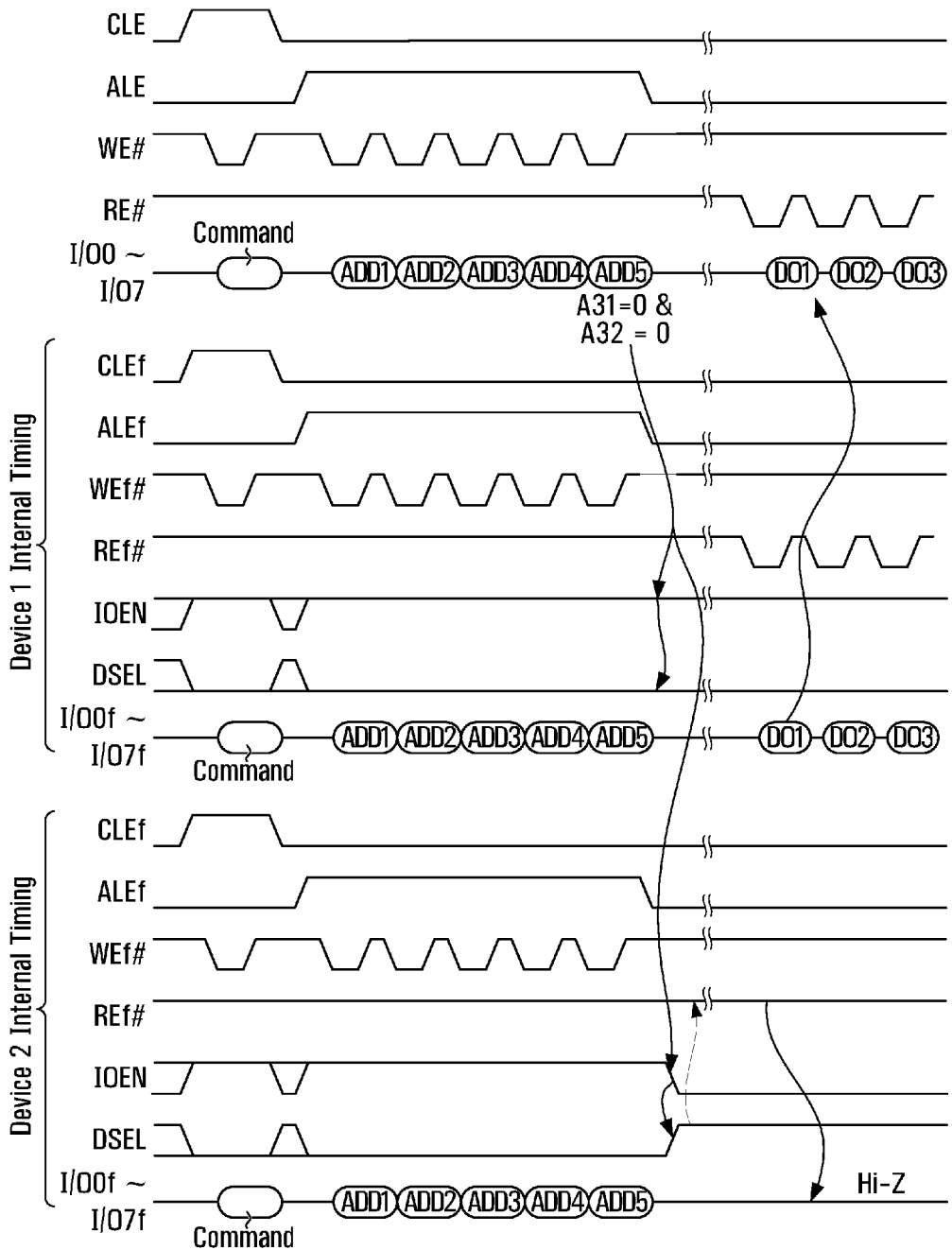
FIG. 24 illustrates command/address/data output timing.

FIG. 24 illustrates command/address/data output timing with the circuits shown in FIG. 22. The output timing is very similar to the input timing shown in FIG. 23. Device 1 is selected and devices 2 to 4 are deselected. For operational timing in FIG. 23, only devices 1 and 2 are shown, but internal timing of devices 3 and 4 are identical to that of device 2. Input address A32 (=0) and A31 (=0) at the 5th address cycle are compared with device ID address ID_A31 and ID_A32 in the Device ID Comparator. The IOEN in device 1 is High while the IOEN in device 2 is Low. The DSEL in device 1 is Low (due to IOEN=High) and doesn't disable the RE# buffer. Therefore 4K bytes read data can be accessed from device 1 during burst data read cycles. The DSEL in device 2 is High (due to IOEN=Low) and disables the WE# buffer. Therefore the buffered REf# signal remains at High, which disables global buffers in device 2 and I/Of0 to I/Of7 remain at Hi-Z state. Devices 3 and 4 behave as device 2.

With the device selection method by input address described here, the device interleave operations (e.g., page program, interleave page read and interleave page read & program and so on) can be performed in same fashion as the device interleave operations described previously.

Operational timing and sequence for device interleave operations with the device selection by input address are not shown because two examples of device selection schemes (e.g., device selection by command and device selection by input address) are nearly identical.

In the embodiments described above, the device elements and circuits are connected to each other as shown in the figures for the sake of simplicity. In practical applications these devices, elements circuits, etc., may be connected directly to each other or indirectly through other devices elements, circuits, etc. Thus, in an actual configuration, the elements, circuits and devices are coupled either directly or indirectly with each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory system comprising:
   a memory controller;
   a plurality of memory devices connected to the controller via a common bus with a multi-drop connection;
   wherein the memory controller performs device selection by input address;
   each memory device comprising:
   a register containing a device identifier;
   a device identifier comparator that compares selected bits of a received input address to contents of the register to determine if there is a match, and wherein a given device is selected if the device identifier comparator of the given device determines there is a match;
   wherein each memory device further comprises a burst data controller that causes the memory device to be selected:
   when the device identifier comparator determines there is a match;
   while a command input is in progress; and
   while an address input is in progress.

2. The memory system of claim 1 comprising:
   a global buffer in which command, data and input address are initially stored upon receipt;
   wherein the device identifier comparator obtains the selected bits of the received input address via the global buffer.

3. The memory system of claim 1 wherein in each memory device, the burst data controller comprises an output that indicates whether the memory device is selected or deselected.

4. The memory system of claim 1 wherein each burst data controller comprises:
   a logic circuit that receives an output of the device identifier comparator, an address latch enable signal that indicates whether an address input is in progress, and a command latch enable signal that indicates whether a command input is in progress, and wherein the logic circuit generates an output that indicates whether the memory device is selected or deselected.

5. A memory system comprising:
   a memory controller;
   a plurality of memory devices connected to the controller via a common bus with a multi-drop connection;
   wherein the memory controller performs device selection by input address;
   each memory device comprising:
   a register containing a device identifier;
   a device identifier comparator that compares selected bits of a received input address to contents of the register to determine if there is a match, and wherein a given device is selected if the device identifier comparator of the given device determines there is a match
   wherein each memory device further comprises:
   a write enable buffer for buffering a received write enable signal, the write buffer having an input for receiving an indication of whether that memory device is selected or deselected, and wherein the write enable buffer is disabled when the memory device is deselected;
   a read enable buffer for buffering a received read enable signal, the read buffer having an input for receiving an indication of whether that memory device is selected or deselected, and wherein the read enable buffer is disabled when the memory device is deselected.

6. The memory system of claim 1 wherein device selection is performed by input address with device interleave operations.

7. The memory system of claim 6 wherein the interleave operation comprises one of:
   page program of a first device interleaved with page program of a second device;
   page program of a first device interleaved with page read of a second device;
   page read of a first device interleaved with page read of a second device.

8. The memory system of claim 1 wherein the plurality of devices comprises a plurality of NAND flash devices that are part of a multi-chip package.

9. The memory system of claim 8 comprising:
   a common chip enable for the plurality of NAND flash devices.

10. A memory system comprising:
a memory controller;
a plurality of memory devices connected to the controller via a common bus with a multi-drop connection;
wherein the memory controller performs device selection by input address;
each memory device comprising:
a register containing a device identifier;
a device identifier comparator that compares selected bits of a received input address to contents of the register to determine if there is a match, and wherein a given device is selected if the device identifier comparator of the given device determines there is a match;
wherein the common bus comprises:
a write protect line;
a write enable line;
a read enable line;
an address latch enable line;
a command latch enable line;
a chip enable line;
an I/O for command, address and data; and
a ready/busy line.

11. A memory device for use in memory system comprising a memory controller, and a plurality of memory devices inclusive of the memory device connected to the controller via a common bus with a multi-drop connection, the memory device comprising:
a register containing a device identifier;
a device identifier comparator that compares selected bits of a received input address to contents of the register to determine if there is a match, and wherein the memory device is selected if the device identifier comparator determines there is a match;
a burst data controller that causes the memory device to be selected:
when the device identifier comparator determines there is a match;
while a command input is in progress; and
while an address input is in progress.

12. The memory device of claim 11 comprising:
a global buffer in which command, data and input address are initially stored upon receipt
wherein the device identifier comparator obtains the selected bits of the received input address via the global buffer.

13. The memory device of claim 11 wherein the burst data controller comprises an output that indicates whether the memory device is selected or deselected.

14. The memory device of claim 11 wherein the burst data controller comprises:
a logic circuit that receives an output of the device identifier comparator, an address latch enable signal that indicates whether an address input is in progress, and a command latch enable signal that indicates whether a command input is in progress, and wherein the logic circuit generates an output that indicates whether the memory device is selected or deselected.

15. A memory device for use in memory system comprising a memory controller, and a plurality of memory devices inclusive of the memory device connected to the controller via a common bus with a multi-drop connection, the memory device comprising:
a register containing a device identifier;
a device identifier comparator that compares selected bits of a received input address to contents of the register to determine if there is a match, and wherein the memory device is selected if the device identifier comparator determines there is a match;
wherein the memory device further comprises:
a write enable buffer for buffering a received write enable signal, the write buffer having an input for receiving an indication of whether that memory device is selected or deselected, and wherein the write enable buffer is disabled when the memory device is deselected;
a read enable buffer for buffering a received read enable signal, the read buffer having an input for receiving an indication of whether that memory device is selected or deselected, and wherein the read enable buffer is disabled when the memory device is deselected.

16. The memory device of claim 11 wherein device selection is performed by input address with device interleave operations.

17. The memory device of claim 16 wherein the interleave operation comprises one of:
page program of the memory device interleaved with page program of a second device;
page program of the memory device interleaved with page read of a second device;
page read of the memory device interleaved with page read of a second device.

18. The memory device of claim 11 wherein the plurality of devices comprises a plurality of NAND flash devices that are part of a multi-chip package.

19. The memory device of claim 18 comprising:
a common chip enable for the plurality of NAND flash devices.

20. A memory device for use in memory system comprising a memory controller, and a plurality of memory devices inclusive of the memory device connected to the controller via a common bus with a multi-drop connection, the memory device comprising:
a register containing a device identifier;
a device identifier comparator that compares selected bits of a received input address to contents of the register to determine if there is a match, and wherein the memory device is selected if the device identifier comparator determines there is a match;
wherein the common bus comprises:
a write protect line;
a write enable line;
a read enable line;
an address latch enable line;
a command latch enable line;
a chip enable line;
an I/O for command, address and data; and
a ready/busy line.

21. A method for use in a memory system comprising a memory controller and a plurality of memory devices connected to the controller via a common bus with a multi-drop connection, the method comprising:
the memory controller performing device selection by input address;
each memory device maintaining a device identifier in a register;
a device identifier comparator in each memory device comparing selected bits of a received input address to contents of the register of the memory device to determine if there is a match, and wherein a given device is selected if the device identifier comparator of the given device determines there is a match;
a burst data controller in each memory device causing the memory device to be selected:

when the device identifier comparator determines there is a match;
while a command input is in progress; and
while an address input is in progress.

22. The method of claim 21 comprising:
each memory device Initially storing command, data and input address are initially stored upon receipt in a global buffer
wherein in each memory device the device identifier comparator obtains the selected bits of the received input address via the global buffer.

23. The method of claim 21 wherein in each memory device, the burst data controller generating an output that indicates whether the memory device is selected or deselected.

24. The method of claim 21 further comprising, in each memory device:
in the burst data controller of the memory device:
a) receiving in a logic circuit an output of the device identifier comparator of the memory device;
b) generating an address latch enable signal that indicates whether an address input is in progress,
c) generating a command latch enable signal that indicates whether a command input is in progress,
the method further comprising the logic circuit generating an output that indicates
whether the memory device is selected or deselected.

25. A method for use in a memory system comprising a memory controller and a plurality of memory devices connected to the controller via a common bus with a multi-drop connection, the method comprising:
the memory controller performing device selection by input address;
each memory device maintaining a device identifier in a register;
a device identifier comparator in each memory device comparing selected bits of a received input address to contents of the register of the memory device to determine if there is a match, and wherein a given device is selected if the device identifier comparator of the given device determines there is a match;
the method further comprising, in each memory device:
buffering a received write enable signal in a write buffer, the write buffer having an input for receiving an indication of whether that memory device is selected or deselected, and wherein the write enable buffer is disabled when the memory device is deselected;
for buffering a received read enable signal in a read buffer, the read buffer having an input for receiving an indication of whether that memory device is selected or deselected, and wherein the read enable buffer is disabled when the memory device is deselected.

26. The method of claim 21 wherein device selection is performed by input address with device interleave operations.

27. The method of claim 26 wherein the interleave operation comprises one of:
page program of a first device interleaved with page program of a second device;
page program of a first device interleaved with page read of a second device;
page read of a first device interleaved with page read of a second device.

28. The method of claim 21 wherein the plurality of devices comprises a plurality of NAND flash devices that are part of a multi-chip package.

29. The method of claim 28 further comprising using a common chip enable for the plurality of NAND flash devices.

30. A method for use in a memory system comprising a memory controller and a plurality of memory devices connected to the controller via a common bus with a multi-drop connection, the method comprising:
the memory controller performing device selection by input address;
each memory device maintaining a device identifier in a register;
a device identifier comparator in each memory device comparing selected bits of a received input address to contents of the register of the memory device to determine if there is a match, and wherein a given device is selected if the device identifier comparator of the given device determines there is a match;
the method further comprising using a common bus comprising:
a write protect line;
a write enable line;
a read enable line;
an address latch enable line;
a command latch enable line;
a chip enable line;
an I/O for command, address and data; and
a ready/busy line.

* * * * *